United States Patent
Pham et al.

(10) Patent No.: US 11,860,189 B2
(45) Date of Patent: Jan. 2, 2024

(54) ROTATIONAL ELECTRICAL PROBE

(71) Applicant: Innova Electronics Corporation, Irvine, CA (US)

(72) Inventors: Phuong Pham, Fountain Valley, CA (US); Ly Ngoc Tran Bach, Ho Chi Minh (VN); Tri Huu Tran, Ho Chi Minh (VN); Douglass Constable, Lake Forest, CA (US); John Joseph Protti, Long Beach, CA (US)

(73) Assignee: Innova Electronics Corporation, Irvine, CA (US)

( * ) Notice: Subject to any disclaimer, the term of this patent is extended or adjusted under 35 U.S.C. 154(b) by 136 days.

(21) Appl. No.: 17/465,111

(22) Filed: Sep. 2, 2021

(65) Prior Publication Data

US 2021/0405088 A1    Dec. 30, 2021

Related U.S. Application Data

(63) Continuation-in-part of application No. 16/712,893, filed on Dec. 12, 2019, now Pat. No. 11,320,462.

(51) Int. Cl.
*G01R 1/067* (2006.01)

(52) U.S. Cl.
CPC .................... *G01R 1/067* (2013.01)

(58) Field of Classification Search
CPC ........ G01R 1/06; G01R 15/12; G01R 15/125; G01R 19/2503
See application file for complete search history.

(56) References Cited

U.S. PATENT DOCUMENTS

| | | |
|---|---|---|
| 3,453,533 A | 7/1969 | Cox |
| 4,034,291 A | 7/1977 | Allen |
| 4,114,095 A | 9/1978 | Pankove |
| 4,168,796 A | 9/1979 | Fulks |
| 4,175,253 A | 11/1979 | Pitegoff |
| 4,757,463 A | 7/1988 | Ballou |
| 4,758,792 A | 7/1988 | Polonis |
| 4,983,910 A | 1/1991 | Majidi-Ahy |
| 5,047,724 A | 9/1991 | Boksiner |
| 5,064,987 A | 11/1991 | Braman |
| 5,293,122 A | 3/1994 | Cake |
| 5,359,290 A | 10/1994 | Cervas |
| 5,394,093 A | 2/1995 | Cervas |

(Continued)

FOREIGN PATENT DOCUMENTS

| | | |
|---|---|---|
| CN | 104597364 | 5/2015 |
| DE | 102011108716 | 2/2012 |

(Continued)

OTHER PUBLICATIONS

Yokogawa Source Measure Unit GS610 Jul. 2005 pp. 1-14.

(Continued)

*Primary Examiner* — Son T Le
(74) *Attorney, Agent, or Firm* — KOS IP Law LLP

(57) ABSTRACT

A probe device has a main body and a probe body with different joints, where each joint rotates along different rotatable directions relative to one another. A user of the probe device may rotate the probe body relative to the main body along two separate rotatable axes to reach behind areas that are difficult to reach into using a probe device without rotatable components.

12 Claims, 15 Drawing Sheets

(56) References Cited

U.S. PATENT DOCUMENTS

| | | |
|---|---|---|
| 5,511,108 A | 4/1996 | Severt |
| 5,541,840 A | 7/1996 | Gurne |
| 5,789,911 A | 8/1998 | Brass |
| 5,923,161 A | 7/1999 | Frankovitch, Jr. |
| 5,930,745 A | 7/1999 | Swift |
| 5,935,180 A | 8/1999 | Fieramosca |
| 6,043,640 A | 3/2000 | Lauby |
| 6,201,320 B1 | 3/2001 | Gallavan |
| D442,101 S | 5/2001 | Kochie |
| 6,313,642 B1 | 11/2001 | Brooks |
| 6,434,504 B1 | 8/2002 | Eryurek |
| 6,448,779 B1 | 9/2002 | Beaver |
| 6,449,574 B1 | 9/2002 | Eryurek |
| 6,466,003 B1 | 10/2002 | Gallavan |
| 6,501,277 B1 | 12/2002 | Sybesma |
| 6,512,361 B1 | 1/2003 | Becker |
| 6,519,546 B1 | 2/2003 | Eryurek |
| 6,608,486 B1 | 8/2003 | Betts |
| 6,653,745 B1 | 11/2003 | Masaki |
| 6,794,859 B2 | 9/2004 | Choi |
| 6,812,685 B2 | 11/2004 | Steber |
| D502,416 S | 3/2005 | Chen |
| 6,870,357 B1 | 3/2005 | Falik |
| 7,330,024 B2 | 2/2008 | Hashimoto |
| 7,828,479 B1 | 11/2010 | Aslan |
| 9,333,914 B2 | 5/2016 | Katsura |
| 10,060,965 B1 | 8/2018 | Skinner |
| 2002/0004684 A1 | 1/2002 | Thomas |
| 2002/0097056 A1 | 7/2002 | Blades |
| 2002/0130668 A1 | 9/2002 | Blades |
| 2002/0135349 A1 | 9/2002 | Steber |
| 2002/0196031 A1 | 12/2002 | Blades |
| 2003/0060092 A1 | 3/2003 | Johnson |
| 2003/0122568 A1 | 7/2003 | Eldridge |
| 2003/0128036 A1 | 7/2003 | Henningson |
| 2003/0184932 A1 | 10/2003 | McNally |
| 2004/0041793 A1 | 3/2004 | Redding |
| 2004/0150383 A1 | 8/2004 | Blais |
| 2004/0239308 A1 | 12/2004 | Fazzina |
| 2005/0052186 A1 | 3/2005 | Grube |
| 2005/0200346 A1 | 9/2005 | Novak |
| 2006/0043959 A1 | 3/2006 | Cavoretto |
| 2006/0145714 A1 | 7/2006 | Cruz |
| 2008/0022471 A1 | 1/2008 | Hilscher |
| 2008/0106832 A1 | 5/2008 | Restrepo |
| 2008/0186044 A1 | 8/2008 | Singh |
| 2008/0197854 A1 | 8/2008 | Valcore |
| 2009/0058435 A1 | 3/2009 | Nakamura |
| 2009/0180233 A1 | 7/2009 | Maity |
| 2011/0025356 A1 | 2/2011 | Nielsen |
| 2011/0238345 A1 | 9/2011 | Gauthier |
| 2012/0274341 A1 | 11/2012 | Fu |
| 2013/0221973 A1 | 8/2013 | Whisenand |
| 2013/0293241 A1 | 11/2013 | Mayer |
| 2013/0325303 A1 | 12/2013 | Kiuchi |
| 2014/0145725 A1 | 5/2014 | Eiswerth |
| 2016/0161560 A1* | 6/2016 | Barden .............. G01R 31/3278 324/415 |
| 2016/0274168 A1* | 9/2016 | Cabot ................. G06F 11/221 |
| 2021/0173016 A1 | 6/2021 | Whisenand |
| 2021/0181239 A1 | 6/2021 | Constable |

FOREIGN PATENT DOCUMENTS

| | | |
|---|---|---|
| DE | 102013013471 | 2/2015 |
| FR | 2662257 | 11/1991 |

OTHER PUBLICATIONS

Patent Cooperation Treaty; International Search Report for PCT/US2013/027195 dated May 13, 2013, 3 pages.
Nstruction Manual for device of KR200253596Y1.
Instruction Manual for the Power Probe 1 & 2 English, The Ultimate Circuit Testers, 14 pages.
Certified translation of DE43 17 598 A1, 10 pages.

* cited by examiner

ROTATIONAL ELECTRICAL PROBE

CROSS-REFERENCE TO RELATED APPLICATIONS

This application is a continuation-in-part application of U.S. patent application Ser. No. 16/712,893, filed 2019 Dec. 12, the disclosure of which is hereby expressly incorporated by reference in its entirety as if set forth herein.

STATEMENT RE: FEDERALLY SPONSORED RESEARCH/DEVELOPMENT

Not Applicable

TECHNICAL FIELD

This application relates to electronic circuit tester systems and methods.

BACKGROUND

Traditional multimeters have a housing comprising measurement circuitry and pen-like terminals (i.e. connectors). These pen-like terminals can be applied to conductive surfaces of an electronic device to measure voltage between two conductive surfaces of the electronic device. A user could turn a dial on the housing of a traditional multimeter to switch the multimeter from one mode to another. Once the traditional multimeter is set to the correct mode, the user could apply the terminals to the electronic device.

Such multimeters, however, may be rather clumsy to use, as the user needs to first find a suitable location to place the multimeter housing, place the housing down on the suitable location, turn the dial, and then use both hands to apply the multimeter terminals to the electronic device while preventing wires connecting the terminal to the housing from pulling the housing away from its location. Other types of terminals with longer wires could be attached to the multimeter, but storing and organizing the different types of terminals within reach of a user may be troublesome, resulting in misplaced terminals. Moreover, the long, pen-like terminals are not easily maneuverable in tight spaces. For example, a test location may be located behind obstructions which block a traditional pen-like terminal from easily reaching the test location.

U.S. Pat. No. 7,848,899 to Cruz teaches an electrical test device having alligator clips disposed at the end of cables. This allows the cables to maneuver around obstructions while a user applies the alligator clips to a test location. Applying alligator clips while reaching around an obstruction, however, is quite difficult without a clear line of sight, and the ability of alligator clips to navigate such areas are limited by the size and configuration of the alligator clips themselves. Cruz' device is also rather clumsy to use, as the user, again, needs to first find a suitable location to place the housing of the electrical test device, place the electrical test device down on the suitable location, apply the alligator clips to a test location, then activate Cruz' keypad to simultaneously apply power and measure parameters, such as voltage, to the device under test.

Moreover, Cruz' device is configured to provide current sourcing to an electrical system while simultaneously providing multi-meter functionality for selective measurement of a plurality of parameters. Such a device can be dangerous to use, as a user may forget to turn off Cruz's power sourcing functionality before removing the alligator clips. This is particularly problematic if Cruz' alligator clips are applied to a test location behind an obstruction, as a user reaching around an obstruction may accidentally touch a conductive area of the alligator clip if the user cannot see behind the obstruction.

Thus, there is a need for improved circuit tester systems and methods for testing electronic devices.

BRIEF SUMMARY

A probe device is disclosed for applying power to, or alternatively for measuring attributes (e.g. voltage, current) of, an electronic circuit under test. The probe device typically has a user interface opposite a finger-gripping surface of a grip. The user interface allows a user to switch the probe device between discrete modes, such as a mode that measures attributes of the electronic circuit under test and a mode that applies power to the electronic circuit under test. The user interface preferably defaults to be in a mode that does not apply power to the electronic circuit under test when a user is not actively applying pressure to the user interface. This maximizes safety during use, so that a forgetful user does not accidentally apply power to themselves. Since the user interface is located opposite the finger-gripping surface of the grip, the probe device has the ability to allow a user to easily and conveniently measure attributes (e.g. voltage, current) of an electronic circuit under test, apply power to an electronic circuit under test, apply ground to an electronic circuit under test, and control operation of the probe device—all with only one hand.

The probe device generally also has a power supply terminal, a ground connector, and a probe connector. The power supply terminal electronically couples to a power source, the grounding terminal electronically couples to a ground source, and the probe connector has a conductive tip that can be applied to a conductive terminal of an electronic circuit under test. A user could couple the power supply terminal to a power source (e.g. by inserting a male plug into a female power supply terminal), couple the ground connector to a ground source (e.g. by clipping an alligator clip to an exposed ground source) and could then maneuver the grip of the probe device to apply the conductive tip of the probe connector to various exposed or obstructed conductive surfaces of the electronic circuit under test. Positioning the probe connector on the end of a handle having a grip and a user interface that controls the probe device improves the ability of a user to control the probe device with only one hand.

The probe device can have a rotatable probe body relative to its main body that allows a user to reach behind areas that are difficult to reach with a straight probe device with only a single straight physical configuration. With such a probe device, when the user needs to apply a conductive probe tip to a conductive surface of the electronic circuit under test, and the conductive surface is blocked by an obstruction, the user can rotate the probe body to change its physical configuration. The altered probe device could then be maneuvered so that the conductive probe tip can reach behind the obstruction to contact the previously inaccessible conductive surface of the electronic circuit under test.

The probe device could also comprise a mechanism, such as an inductive clamp, useful to measure current through a wire. Preferably the probe device is configured so that the user of the probe device could simply depress a lever to open the clamp and place the clamp over a wire of the electronic circuit under test and release the lever to close the clamp around the wire. Current running through the wire could then be easily and conveniently measured. Preferably both the probe connector and the inductive clamp are mounted to an end of the probe device opposite a handle that the user holds, to allow for easy operation of both the probe connector and the inductive clamp by a user holding the probe device by its handle.

In one embodiment, the probe device has a probe body and a main body that are pivotally coupled to one another to change the shape and configuration of the probe device, allowing the probe connector to reach obstructed or otherwise hard-to-access conductive areas of the electronic device. In one configuration, the probe body and the main body could be aligned together, such that a probe axis of the probe connector along the probe connector length and a main axis of the main body along the main body length are substantially co-axial or parallel to one another. In another configuration, a user could move the probe body about a joint between the probe body and the main body to pivot or rotate the probe connector between at least two angled positions relative to the main axis of the main body. In this manner, portions of the probe device could be tilted and/or rotated such that the probe axis and the main axis are oriented at different angles relative to one another. This allows the probe connector to reach hard-to-access areas of the electronic device that would be otherwise unreachable if the probe body were unable to pivot or rotate relative to the main body.

A main switch on the grip of the probe device can be manipulated by a user to switch a mode of the probe device. The main switch could switch the probe device between different modes, for example a measuring mode that instructs the probe device to measure an attribute (e.g. voltage, current) of a circuit via the probe connector, a power mode that instructs the probe device to apply power from the power supply terminal to the probe connector, and a ground mode that instructs the probe device to apply ground from the ground connector to the probe connector. The main switch could have more or less modes in other embodiments, and/or additional switches could be used to allow or activate additional features of the probe device, such as a voltage switch that alters how much voltage to send from the power supply terminal to the probe connector when the probe device is in power mode, or a current switch that instructs the probe device to measure current instead of voltage and/or shifts the probe device between or among one or more other current measurement modes.

In some embodiments, the probe body could have an inductive clamp that allows the probe device to measure current via induction. This allows the probe device to measure voltage using the probe connector and allows the probe device to measure current via the inductive clamp. The inductive clamp could have a lever coupled to the grip that allows a user to pull the lever to open the clamp and release the lever to close the clamp over a wire under test, or vice-versa. The inductive clamp could be positioned on a side of the probe connector, allowing a user to use the inductive clamp or any probe connector simply by manipulating the grip of the probe device and controlling the probe device with a thumb—all without the user ever needing to remove his/her hand from the probe device. Another switch of the probe device could be used to switch the inductive clamp on and off, and/or could be configured to adjust a mode of the inductive clamp between a plurality of modes (e.g. a 1 mV/A mode and a 10 mV/A mode) Preferably, one or more switches is positioned on a user interface opposite a clamp lever, allowing a user to operate the user interface (e.g. measure/apply voltage, adjust settings) with a thumb while simultaneously operating the clamp lever with a finger, such as an index finger.

Another probe device may have a main body comprising a grip and a probe body comprising a conductive probe connector used to test conductive test sites of a unit under test. The main body and the probe body may be rotatably coupled together in any suitable manner, for example by using at least two joints that each rotate along different axes or different rotatable directions relative to one another. One or more joint bodies may be interposed between the probe body and the main body to form the joints. Any joint that allows one body to rotate relative to the other body may be used, such as a hinge joint, a rotary joint, a pivot joint, a ball and socket joint, a saddle joint, or a condyloid joint may be used. For example, the joint body may comprise a pair of knuckles configured to wrap around a pin of the probe body to form a hinge joint that allows the probe body to rotate about the pin. The joint body may also comprise a housing having a cavity that accepts a shaft of the main body to form a rotary joint that allows the joint body to rotate about the shaft. Allowing the probe body and the main body to rotate along different axes allows the probe body to contact hard-to-reach areas without needing to dramatically rotate the main body.

The probe device may have a conductive ground connector in addition to a conductive probe connector. The conductive probe connector may extend from the probe body of the probe device, for example as a cylinder with a conductive tip that may be placed in contact with a conductive test site of the unit under test. The conductive ground connector may extend from the main body of the probe device, for example as a wire having an alligator clip that may couple to a ground source. A user may use the conductive ground connector and the conductive probe connector to test conductive test sites of an electronic unit, for example by touching the conductive ground connector to a conductive ground source while touching the conductive probe connector to a conductive test site of the unit under test. Where the unit under test is connected to a power supply, a user may perform an electric load continuity test by touching the conductive probe connector to different locations along a conductive path. The user interface of the probe device may have a display that shows voltage levels for each location that the conductive probe connector touches along a conductive path, which allows a user to view when a voltage level of one test site may be lower than a voltage level of another test site. A drop in voltage levels between locations may indicate to a user where a bad connection may be located.

A portion of the probe connector may also be configured to heat to a temperature high enough to melt solder, for example a probe tip of the probe connector may be configured to heat to at least 350° F., 365° F., 375° F. and 400° F. The probe body may comprise a heating circuit configured to heat the conductive probe connector when a current is directed through the heating circuit. The heating circuit may comprise a resistor designed to warm a portion of the probe connector to at least 365° F. when a current is directed through the heating circuit. The user interface of the main body may have a soldering switch that triggers activation of the heating circuit when the soldering switch is activated. The probe connector may extend from an insulated sleeve that prevents an amount of heat from conducting from the heating circuit to an exterior surface of the insulated sleeve. The insulated sleeve may also prevent current from conducting from a conductive wire connected to the probe connector to an exterior surface of the insulated sleeve.

A computer processor of the probe device may be configured to measure a metric between the conductive probe connector and the conductive ground connector, such as a voltage or a current. The measured metric may be transmitted to a display of the user interface for a user to view. The main body may comprise a grip and a user interface that allows a user to provide the processor with a command via one or more switches, such as a command from a voltage switch to measure a voltage between the probe connector and the ground connector, a command from a current switch to measure a current between the probe connector and the ground connector, or a command from a soldering switch to activate a heating circuit that heats a conductive probe connector.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
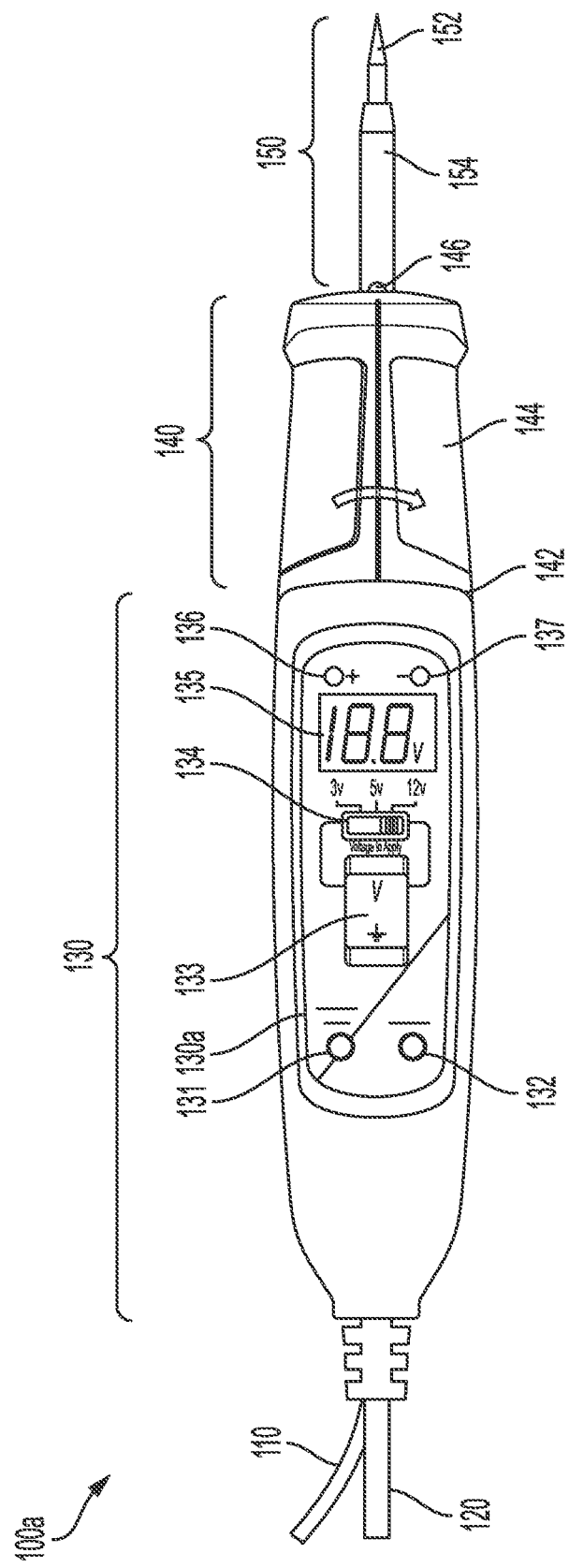
FIG. 1 shows a top view of an exemplary probe device having a probe body and a main body coupled by a joint 142.

Referring now to the drawings, various probe devices are shown for measuring attributes and/or applying power to an electronic circuit under test.

Figure 2:
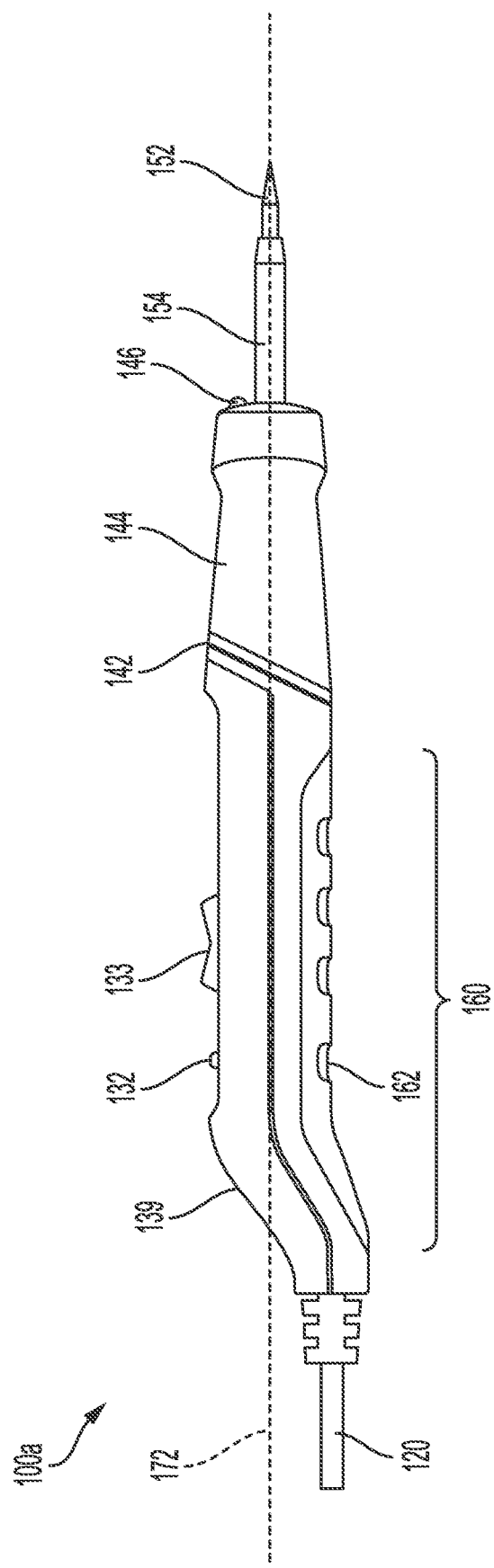
FIG. 2 shows a side view of the probe device of FIG. 1.
Figure 3A:
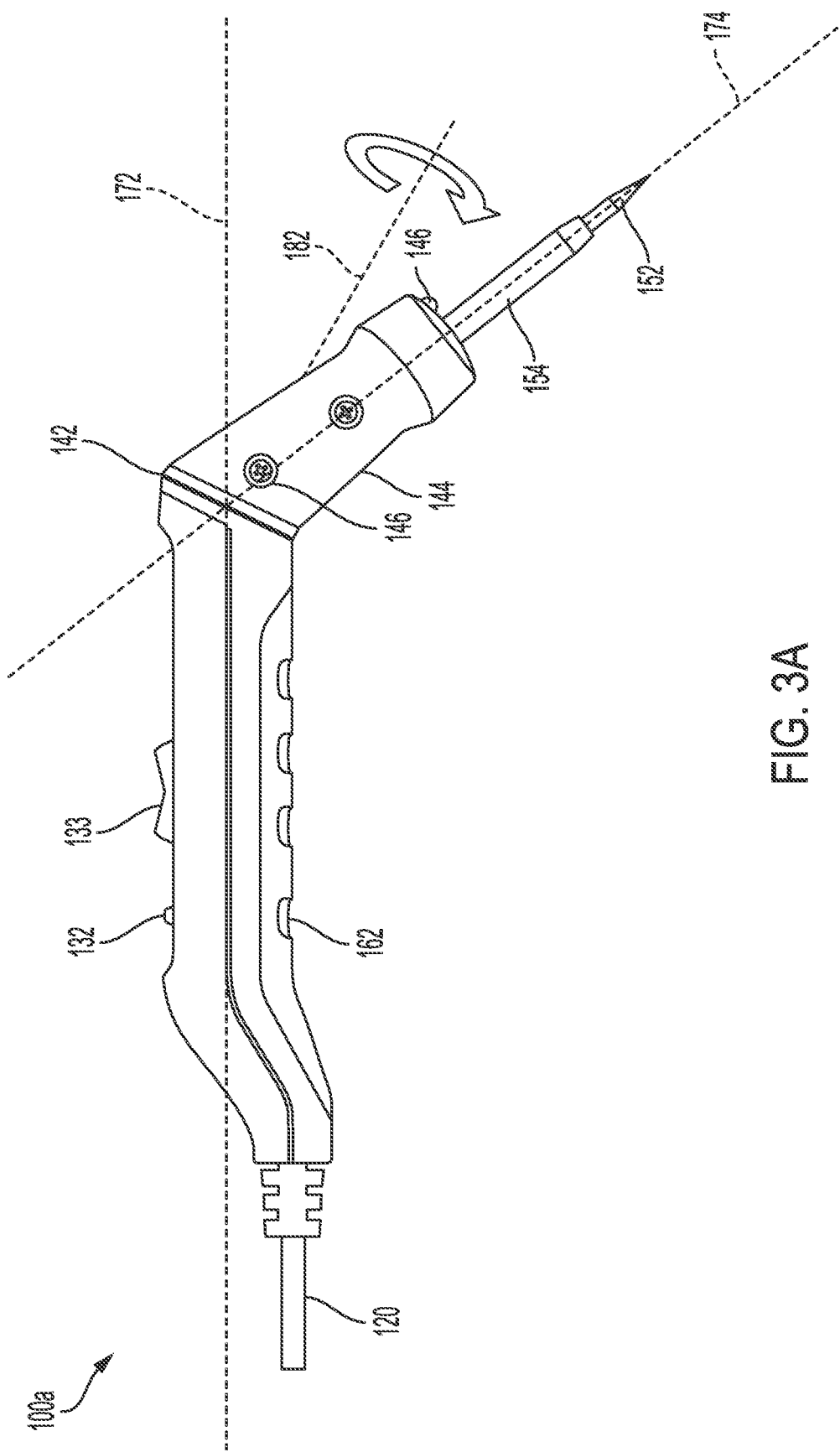
FIG. 3A shows a side view of the probe device of FIG. 2, having the probe body and the main body rotated about the joint 142.

Probe device 100a, shown in FIGS. 1-3A, can have rotatable probe body 140 that allows a user to extend the conductive tip 152 of probe connector 150 into areas which are difficult to reach into with a straight probe body. A user may apply the conductive probe tip 152 to a conductive surface of an electronic circuit under test where the conductive surface is blocked by an obstruction that cannot accommodate the straight probe device 100a shown in FIG. 2 from reaching. The user may then rotate probe body 140 relative to main body 130 as shown in FIG. 3A to change the orientation of the probe connector 150 relative to the orientation of the main axis of the probe body and/or handle so that the conductive probe tip 152 can reach behind the obstruction to contact the conductive surface of the electronic circuit under test.

Figure 6A:
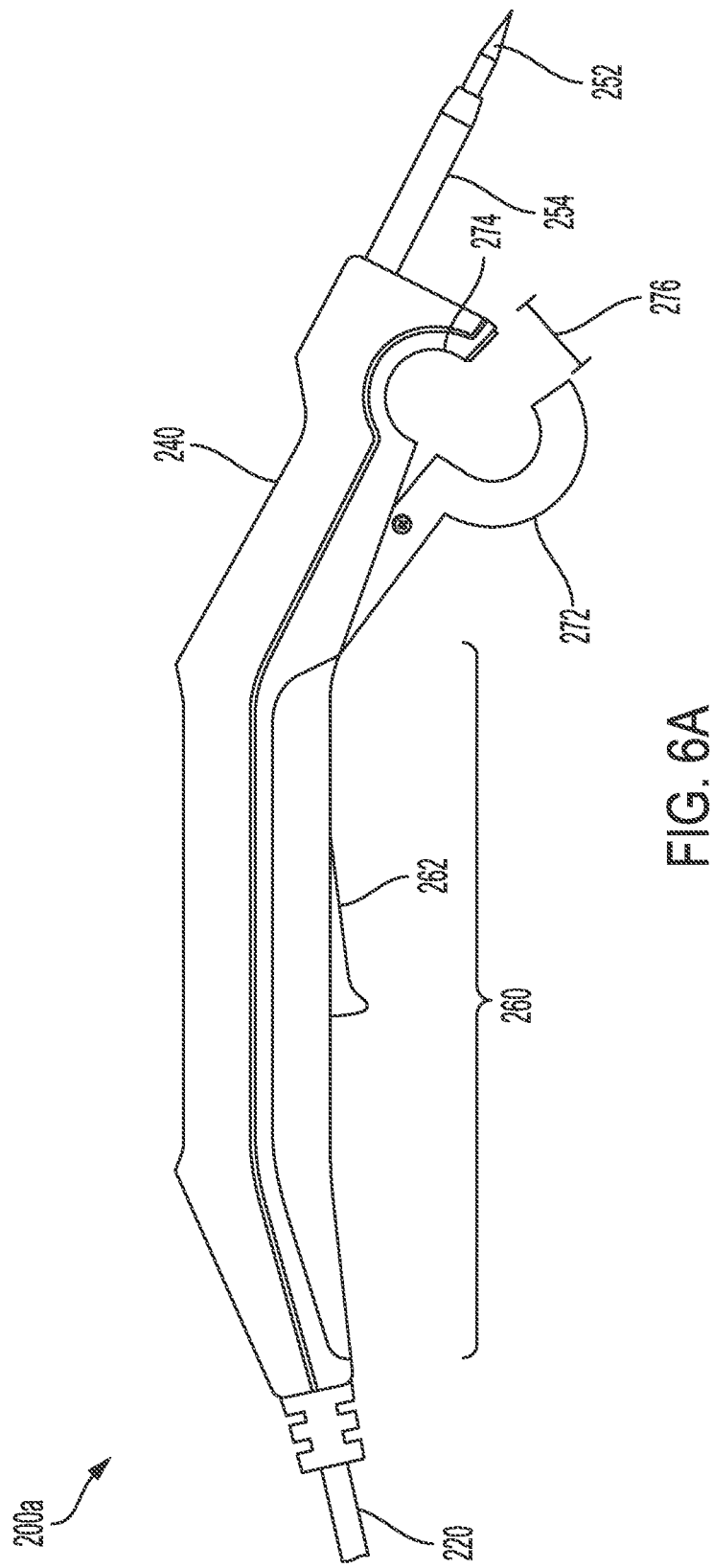
FIG. 6A shows a side view of the probe device of FIG. 5 having a lever depressed to open the inductive clamp.

Probe device 200a, shown in FIGS. 4-6A, can have an inductive clamp 270 that could be used to indirectly measure current flowing through a wire that is disposed within an aperture defined by clamp 270. The user could simply depress lever 262 to move hinged core 272 as shown in FIG. 6A to open up inductive clamp 270. The user may then move probe device 200a such that a wire, such as wire 275, associated with an electronic circuit under test is disposed within aperture 273, defined by hinged core 272 and stationary core 274. The user could then release lever 262 to close inductive clamp 270 about wire 275 to easily and conveniently measure current through the wire.

Another probe device 400 is shown in FIGS. 8-12, having a main body 410 and a probe body 430 coupled together by a joint body 420 and a pin 440. The probe body 430 may be rotatable relative to the joint body 420 along an axis 452. The main body 410 may be rotatable relative to the joint body 420 along an axis 454. As shown in FIG. 13, a user may rotate the probe body 430 relative to the main body 410 to allow the user to easily grip the main body 410 and view the user interface display 412 while moving the conductive probe tip 432 to touch a conductive test site of an electronic circuit under test, such as conductive test sites 522 and 524. Alternatively, the user may rotate the main body 410 while holding the probe body 430 to ensure that the user may view the user interface display 412 when using the probe device 400.

Aspects of these, and other, embodiments are described in further detail below.

Referring now to FIGS. 1-7, probe device 100a is shown in FIGS. 1-3A having a main body 130 and a probe body 140. Main body 130 comprises a grip 160 while probe body 140 comprises a probe connector 150, allowing a user of probe device 100a to easily apply probe connector 150 to any location on an electronic device to test (not shown) without needing to use a second hand. Grip 160 comprises a gripping surface with ergonomic features, such as indents 162 configured to receive fingers of a user's hand and improve friction force between a user's hand (not shown) and grip 160. While grip 160 is shown as having indents 162, grip 160 could be shaped in any suitable way to allow for a user's fingers to easily grip the surface of grip 160. Grip 160 could be made of any suitable material, such as a rubber, a thermoplastic, or a metal, but preferably comprises a non-conductive material having a higher elasticity than a non-conductive shell 139 of main body 130, allowing for a user's hand to slightly compress grip 160 during gripping to increase the friction force between the user's fingers and grip 160. For example, grip 160 may comprise a rubber having less than 1 GPa while the shell 139 may comprise a thermoplastic having more than 10 GPa.

Probe device 100a also has a power connector 120, a ground connector 110, and a probe connector 150, allowing probe device 100a to alternatively apply either power or ground to probe connector 150. Power connector 120 is configured to couple to a power source. For example, in one embodiment power connector 120 could comprise a 6-foot wire that terminates in a male plug configured to plug into a female A/C outlet. In another embodiment, power connector 120 could comprise a 3-foot wire that terminates in an insulated alligator clip configured to electronically couple to a positive terminal of a car battery (or other DC power source) or a cigarette plug for power. Ground connector 110 is configured to couple to a ground source, such as a conductive body via an alligator clip at the end of an 18-inch wire of ground connector 110 or a male digital multimeter (DMM) jack. Probe connector 150 is configured to be applied to a conductive surface of an electronic device via conductive tip 152.

Probe connector 150 comprises a conductive core that ends in a sharpened conductive tip 152 and comprises an insulation sleeve that limits the exposed conductive surface of probe connector 150. While power connector 120 is shown as a wire having a plug, ground connector 110 is shown as a wire having an alligator clip, and probe connector 150 is shown as a post having a beveled conductive tip, each of power connector 120, ground connector 110, and probe connector 150 could be configured in any suitable manner to electronically couple to an appropriate power source, ground source, and conductive surface, respectively. Both power connector 120 and ground connector 110 are preferably configured to couple to a power source and ground source, respectively, in a manner that holds them in place without any external force needing to be applied by a user, such that they stay coupled while a user moves probe device 100*a* with his/her hand, which could apply some lateral forces to any wires of power connector 120 and ground connector 110. This allows a user to freely move probe connector 150 around an electronic device without needing to worry about decoupling either power connector 120 or ground connector 110. Contemplated coupling mechanisms include biased clamps, mating indents and detents, male and female plugs, and threaded connections.

Probe connector 150 is preferably plug engageable with to a female outlet (not shown) of probe body 140 and is held in place within probe body 140 using friction force, such as a mating elastic indent/detent that holds an end (not shown) of probe connector 150 in place within the female outlet of probe body 140. Such receptacle jacks could be similar to those used for a DMM jack. In some embodiments, probe connectors of different shapes and/or sizes could be plugged into the female outlet to allow for different types of probe connectors to be coupled to probe body 140. For example, probe connectors that are J-shaped, angled, offset, thin, or flexible could be interchanged with probe connector 150 to plug into the same outlet. While ground connector 110 and power connector 120 are shown here as coupled to main body 130 and probe connector 150 is shown here as coupled to probe body 140, the terminals of probe device 100*a* could be coupled to any suitable portion of probe device 100*a* to allow for electricity to flow from the conductive surface of the terminal to the internal circuitry of probe device 100*a*.

User interface 130*a* is disposed on a top surface of main body 130. User interface 130*a* is preferably placed on an opposite side of grip 160 on probe device 100*a* to allow for a user's fingers to grip the surface of grip 160 while the user's thumb is positioned to manually regulate the operation of elements of user interface 130*a*. This allows a user to manipulate any switches of user interface 130*a* without needing to move the user's fingers from grip 160 or move probe device 100*a* in any manner to displace probe connector 150 in order to interact with user interface 130*a*. In some embodiments, another user interface could be positioned opposite user interface 130*a*, for example a trigger that activates a light, such as light 146. In such an embodiment, the user could activate the trigger with a forefinger while simultaneously regulating operation of user interface 130*a*.

User interface 130*a* has a breaker reset button 131, a beeper button 132, a main switch 133, a voltage switch 134, a display 135, a positive light 136, and a negative light 137. Main switch 133 is shown as a 3-position rocker switch having an overmold rubber cover that allows a user to push forward to a forward position (or power position) to switch main switch 133 to a positive applied voltage mode, backward to a rear position (or ground position) to switch main switch 133 to a negative, or ground, applied voltage mode, and to the center position (or measure position) to switch main switch 133 to a voltage measure mode. Main switch 133 is preferably biased to return to the measure position when no force is placed on main switch 133 (e.g. when a user releases a thumb from main switch 133) so that probe device 100*a*, by default, measures attributes of the electronic circuit under test. Main switch 133 could be configured to be biased to return to the measure position using any suitable means, for example by using a spring or a resiliently deformable flange. Preferably, main switch 133 is configured such that main switch 133 is only in one position at a time, which prevents probe device 100*a* from being placed in a mode that can both apply power and measure voltage or current simultaneously.

Referring to the exemplary embodiment having three positions (a power position, a ground position, and a measure position) above, when main switch 133 is in the power position, a processor (not shown) in probe device 100*a* preferably transmits power from power supply connector 120 to probe connector 152. The amount of power applied can be controlled by manipulation of voltage switch 134, which is shown as controlling the power output between 3 volts, 5 volts, and 12 volts. When a user moves voltage switch 134 from the 3-volt position to the 12-volt position, the amount of voltage applied to probe connector 150 when main switch 133 is pushed to the power position is changed from 3 volts to 12 volts. Preferably display 135 does not show any numerical values while main switch 133 is in the power position, allowing a user to quickly note that probe device 100*a* is not in measurement mode with a quick glance at display 135. While voltage switch 134 is shown as being configured to allow a user to switch the power output between three different modes, more or fewer switching modes, such as two modes or five modes, could be used in alternative embodiments.

Probe device 100*a* is configured to display voltage values on display 135 when probe device 100*a* is in measure mode. Display 135 is configured to display voltage that is measured by probe connector 150. For example, when main switch 133 is in the measure position and conductive tip 152 probe connector 150 is applied to a conductive surface of an electronic circuit under test, display 135 will display the measured voltage on display 135. As noted previously, when main switch 133 is in the measure position, no power is applied to probe connector 150 from probe device 100*a*. In preferred embodiments, this measured voltage will continue to be shown on display 135 until a user moves main switch 133 to another position, or until power connector 120 is unplugged from a power source. In this way, if a user is not able to see display 135 when probe connector 150 is applied to an electronic device and main switch is in the measure position, the user can later look at display 135 to see what the measured voltage is.

In some embodiments, the measured voltage may change over time, such as when a conductive surface has a periodic voltage shift, or when a user applies probe tip 152 to many different conductive surfaces while main switch 133 is in a measure position. In this embodiment, a memory (not shown) of probe device 100a could save a series of measured voltages at different periods of time and could replay those voltages in a loop on display 135. The periods of time could be preprogrammed or could be set by a user via a separate connection (e.g. a Bluetooth wireless connection or a USB connection). For example, a user or an admin could set probe device 100a to save 5 seconds of voltage measurements, one for every 0.1 seconds, or 10 seconds of voltage measurements, one for every 0.5 seconds. In other embodiments, a user could save measured voltages, for example by pushing down on main switch 133 (i.e. towards grip 160) while main switch 133 is in the measure position.

Probe device 100a could also be configured to activate positive light 136 when main switch 133 is in the power position and activate negative light 137 when main switch 133 is in the ground position, rapidly informing a user of probe device 100a when probe connector 150 is safe to touch. When power is not applied to probe connector 150, for example when main switch 133 is in the measure position, probe device 100a could be configured to activate positive light 136 when probe connector 150 measures a non-zero voltage, and could be configured to activate negative light 137 when probe connector 150 measures a ground charge. Again, this rapidly informs a user when probe connector 150 is safe to touch. Positive light 136 is preferably a red LED to provide a warning notification while negative light 137 is preferably a greed LED to provide a safety notification, although other colors and/or types of light are contemplated.

Beeper button 132 provides a way for a user to activate or deactivate a beeper that activates when probe connector 150 is not safe to touch, for example when a positive voltage is measured via probe connector 150 when probe device 100a is in measure mode, or when a positive voltage is applied to probe connector 150 when probe device 100a is in a power mode. The beeper speaker preferably deactivates when probe connector 150 is safe to touch, for example when a ground voltage is measured via probe connector 150 when probe device 100a is in measure mode or when a ground voltage is applied to probe connector 150 when probe device 100a is in a ground mode. In this manner, the speaker (not shown) could act similarly to positive light 136 and negative light 137, providing an auditory signal that probe connector 150 is safe or not safe to touch in addition to the visual signal of positive light 136 and negative light 137.

Breaker reset button 131 provides a way for a user to reset an internal fuse (not shown) of probe device 100a. The internal fuse shuts off power between power connector 120 and electronic components of probe device 100a when a voltage or a current exceeds a predefined threshold to prevent electronic components from being damaged. When a user presses breaker reset button 131, the internal circuit breaker is reset, allowing power to flow from power connector 120 to the internal circuitry of probe device 100a.

A user of probe device 100a may attempt to apply probe connector 150 to conductive terminals that are difficult to reach, such as terminals behind an obstacle or at an awkward angle from where a user is. In these situations, it is useful to alter an angle between the probe axis 174 of probe body 140 relative to the main axis 172 main body 130, such as in the configuration shown in FIG. 3A. Main body 130 has a main axis 172 running along its major length shown in FIG. 2, while probe body 140 has a probe axis 174 running along its major length shown in FIG. 3A. In FIG. 2, main axis 172 is shown as substantially parallel to probe body 174 while in FIG. 3A, main axis 172 is shown as angled at substantially a 60-degree angle to probe body 174. As used herein, two axis that are substantially parallel to one another are parallel to one another within 1, 2, 3, 4, or 5 degrees from one another.

Joint 142 is shown here as a rotational condyloid joint having an ovoid cross-sectional rotation surface. A user can rotate probe body 140 relative to main body 130 by twisting probe body 140 in a clockwise or counter-clockwise direction to rotate probe body 140 between a first configuration shown in FIG. 2 and a second configuration shown in FIG. 3A about rotational axis 182. Preferably, main body 130 and probe body 140 are configured to have mating indents and detents that hold the two bodies in place relative to one another when in the first configuration and in the second configuration.

While joint 142 is shown as a rotational condyloid joint, any suitable joint or pivot point could be used to allow main body 130 and probe body 140 to rotate relative to one another, such as a hinge joint, a pivot joint, a ball and socket joint, or a saddle joint. Likewise, while joint 142 allows a user to rotate main body 130 and probe body 140 between only two different angles relative to one another, joint 142 could be configured to allow main body 130 and probe body 140 to rotate to many different angles relative to one another, for example a parallel angle, a 30 degree angle, a 60 degree angle, a 90 degree angle, a 120 degree angle, and so on and so forth.

While only two bodies—main body 130 and probe body 140—are shown coupled to one another via a joint 142, probe device 100a could comprise any number of components that rotate relative to one another in any number of ways in alternative embodiments. Probe device embodiments having a plurality of joints may be useful to thread a probe device through a complex passageway.

Portions of probe device 100a are shown as having a non-conductive rubber overmold having an elastic tensile strength (e.g. less than 1 GPa) used to improve friction tension for when a user grips the overmold areas, and to decrease abrasive damage that could be caused by a user brushing up against a nonelastic surface. Preferably, main switch 133 has a rubber overmold to assist a user who moves main switch 133 from one position to another position, breaker reset button 131 and beeper button 132 have rubber overmolds to assist a user to push the buttons to activate a breaker or activate/deactivate a beeper, and portions of probe body 140 have rubber overmold 144 to assist a user to rotate probe body 140 relative to main body 130.

A probe light 146 is preferably mounted on an end of probe body 140 to illuminate an area that probe connector 150 is applied to. Probe light 146 is preferably a white, bright LED, although any color and/or type of light could be used in alternative embodiments. Probe light 146 preferably activates when a user pushes or pulls on main switch 133, and deactivates after a threshold time period has passed, such as 1-2 minutes. While probe light 146 is shown as coupled to an end of probe body 140, probe light could be coupled to any portion of probe device 100a in alternative embodiments, and could be even mounted to a stiff arm that could be aimed by a user by manipulating the stiff arm. Activation of probe light 146 could be triggered in any suitable manner, for example by an accelerometer that detects a minimum threshold movement of probe device 100a, or by an index-finger trigger located on grip 160 of probe device 100a.

Figure 3B:
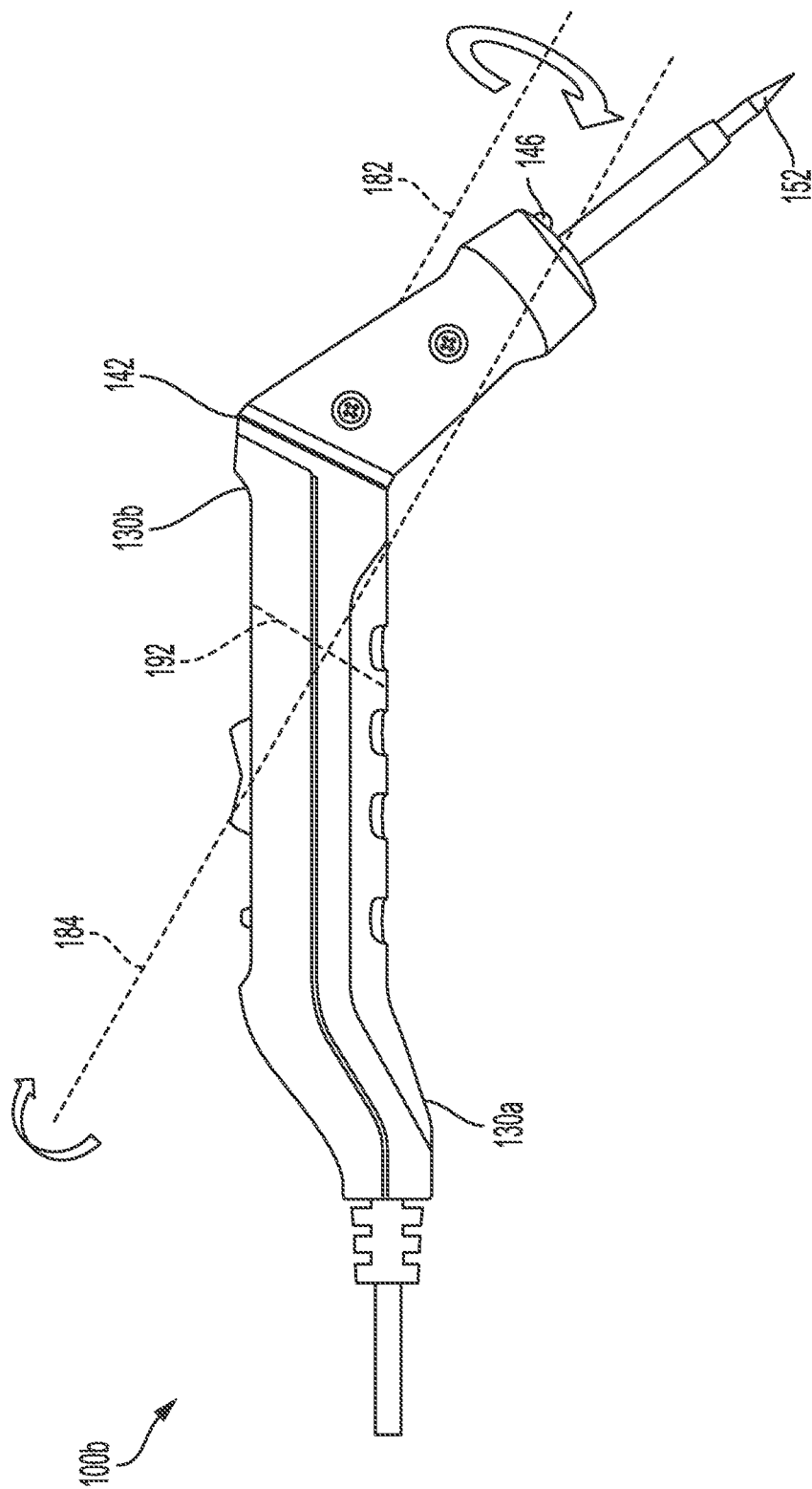
FIG. 3B shows a side view of an alternative probe device having a second joint 192 that could be used to rotate the probe connector to be offset the main axis of the main body.

FIG. 3B shows an alternative probe device 100b having first joint 142 and second joint 192. Second joint 192 comprises a second condyloid joint that rotates a first portion of main body 130a relative to a second portion of main body 130b about a rotational axis 184. A user could rotate the second portion of main body 130b relative to probe body 140 about first joint 142 and rotational axis 182 and rotate the first portion of main body 130a relative to the second portion of main body 130b about second joint 192 and rotational axis 184 to offset conductive probe tip 152 from the first portion of main body 130a. This could be useful in scenarios where a user needs to snake conductive probe tip 152 just to the side of an obstacle.

Figure 3C:
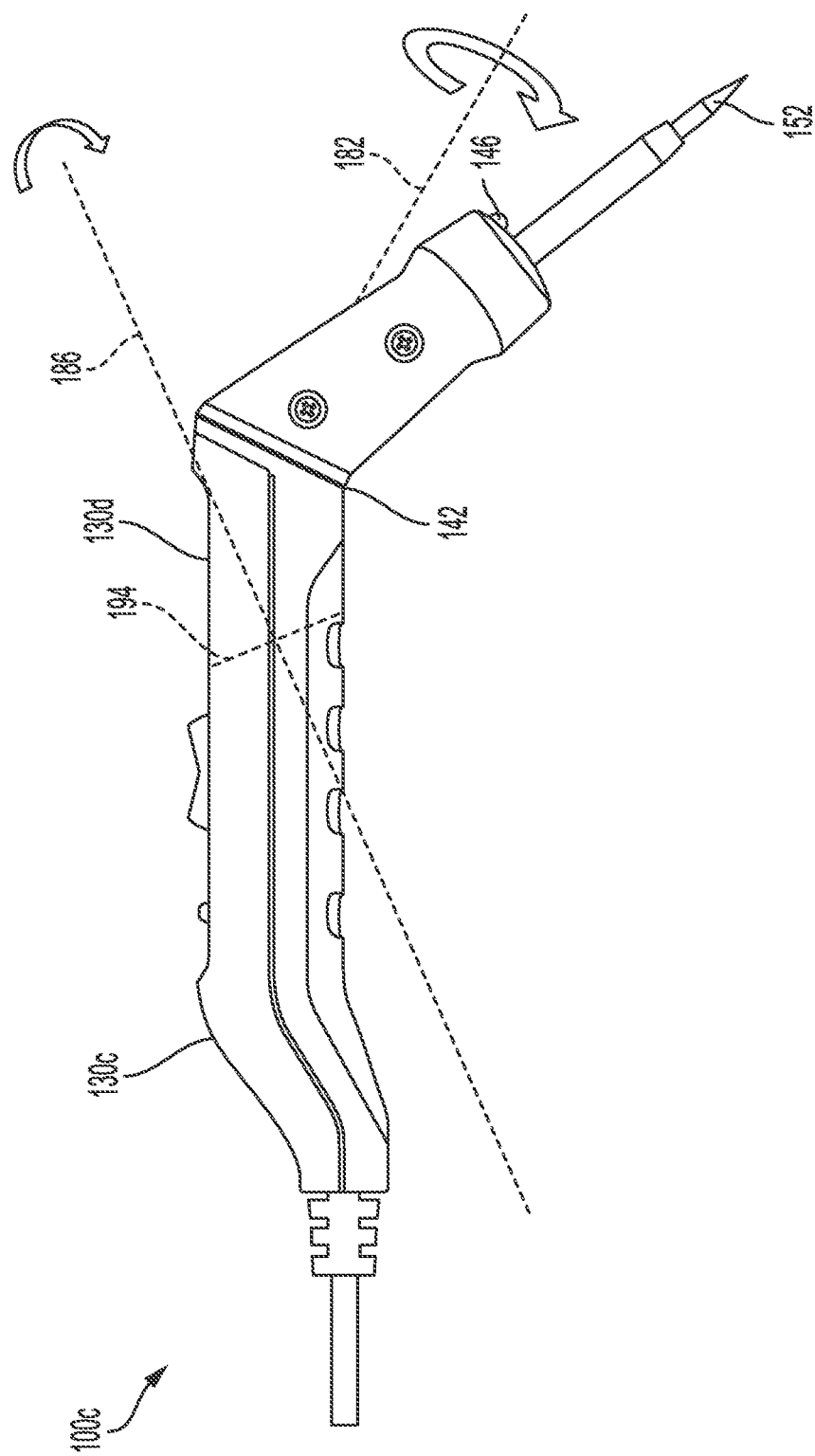
FIG. 3C shows a side view of an alternative probe device having a second joint 194 that could be used to rotate the probe device to have a U-shape.

FIG. 3C shows another alternative probe device 100c having a first joint 142 and a second joint 194. Second joint 194 comprises another condyloid joint that rotates a first portion of main body 130c relative to a second portion of main body 130d about rotational axis 186. Similar to probe device 100b, a user of probe device 100c could rotate the second portion of main body 130d relative to probe body 140 about first joint 142 and rotational axis 182 and rotate the first portion of main body 130c relative to the second portion of main body 130d about second joint 194 and rotational axis 186 to offset conductive probe tip 152 from the first portion of main body 130a. This could be useful in scenarios where a user needs to snake conductive probe tip 152 around an obstacle in a U-shaped manner to wrap around the obstacle. While a condyloid joint is shown in FIGS. 3B and 3C, any other suitable joint could be used to alter a shape of probe device 100b or 100c to allow conductive probe tip 152 to access previously inaccessible areas.

An alternative probe device 200a is shown in FIGS. 4-6A, where the main body 230 and the probe body 240 are formed of a single contiguous piece. Probe device 200a is similar to probe device 100a, in that probe device 200a also has a power connector 220, a ground connector 210, a probe connector 250, and a grip 260 opposite a user interface 230a, wherein user interface 230a has a breaker reset button 231, a beeper button 232, a main switch 233, a voltage switch 234, a display 235, a positive light 236, and a negative light 237, which each function similarly to their corresponding parts on probe device 100a. However, probe device 200a has an induction clamp 270 that could be used to inductively measure a current in wire 275 clamped by induction clamp 270.

Induction clamp 270 comprises a clamp that inductively measures current via an inductive coil. Typical induction clamps use a hinged core with a compensation winding wrapped around a portion of the core, where the opening of the clamp acts as a magnetic field sensor within an air gap. Any suitable induction clamp could be used. Induction clamp 270 comprises a stationary core 274 embedded within a bottom section of probe body 240 and comprises a hinged core 272 controlled by lever 262 on grip 260. When a user's fingers (e.g. a user's forefingers or index and middle fingers) pull on lever 262, hinged core 272 opens, as shown in FIG. 6A, allowing the user to dispose induction clamp 270 around wire 275 for indirectly measuring a current through wire 275. Lever 262 is preferably biased, for example using a spring, to open when force is applied to lever 262, allowing a user to close hinged core 272 by simply releasing a compressive force on lever 262.

User interface 230a comprises a current switch 238 that is configured to allow a user to activate an inductive current-measuring mode, and to alter the amount of currents measured by the probe device. Both the voltage-measuring mode and the current-measuring mode are preferably modes wherein probe 200a does not apply any voltage to probe connector 250. Here, current switch 238 is shown as a switch that switches probe device 230 between three modes—an off mode, a 1 mV/A mode, and a 10 mV/A mode. More or less modes could be used in other embodiments. When current switch 238 is switched to off mode, probe device 230 is configured to measure volts flowing through probe connector 250 only, allowing probe device 230 to act similarly to probe device 130. Display 235 is configured to display a VOLT indicator, which indicates to a user that probe device 230 is in volt measurement mode. When current switch 238 is switched to 1 mV/A mode, probe device 230 is configured to measure a first range of amps flowing through probe connector 250 (e.g. 5 A to 300 Arms). In 1 mV/A mode, display 235 displays an AMP indicator, which indicates to a user that probe device 230 is in current measurement mode. When current switch 238 is switched to 10 mV/A mode, probe device 230 is configured to measure a second range of amps flowing through probe connector 250 (e.g. 50 A to 3000 Arms). In 10 mV/A mode, display 235 also displays an AMP indicator, indicating to a user that probe device 230 is in current measurement mode.

Clamp 270 is preferably disposed adjacent to probe connector 250, which allows a user to easily manipulate the position of probe connector 250 by manipulating grip 260 with only one hand.

User interface 230a is disposed to be slightly recessed from an upper surface of main body 230, allowing portions of the user interface, such as breaker reset button 231, beeper button 232, and main switch 233 to remain below an upper plane 280 of probe device 200a. This allows a user to set probe device 200a down on the side of user interface 230a without danger of contact with a table surface or a floor surface accidentally interacting with user interface 230a (e.g. pressing any buttons or pushing any switches of user interface 230a). The upper surface of main body 230 preferably has a recess 282 to form legs 284 and 286, which further assist in allowing a user to place probe 200a on a surface with the upper surface of main body 230 facing down without accidentally activating any of the buttons or switches on user interface 230a.

Figure 6B:
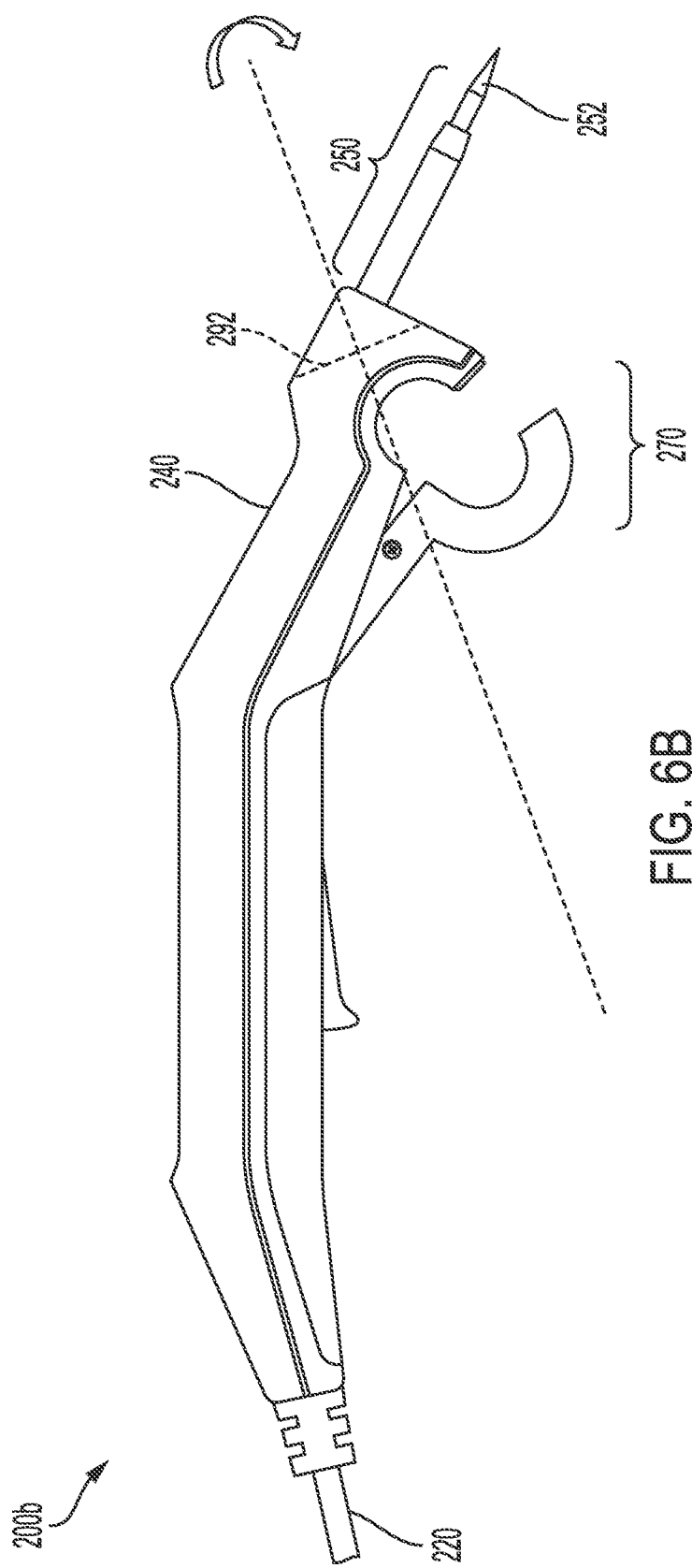
FIG. 6B shows a side view of an alternative probe device having a joint 292 on a top end of the probe body.

FIG. 6B shows an alternative probe device 200b having a joint 292 along a top edge of probe body 240. Joint 292 represents another condyloid joint that allows probe connector 250 to rotate at a substantially 90-degree angle relative to the orientation shown in FIG. 6B, allowing conductive probe tip 252 to reach around obstacles to contact conductive surfaces of an electronic circuit under test that probe device 200b was previously unable to reach. While a condyloid joint is shown, any other suitable joint could be used to alter a shape of probe device 200b to allow conductive probe tip 252 to access previously inaccessible areas.

Figure 7:
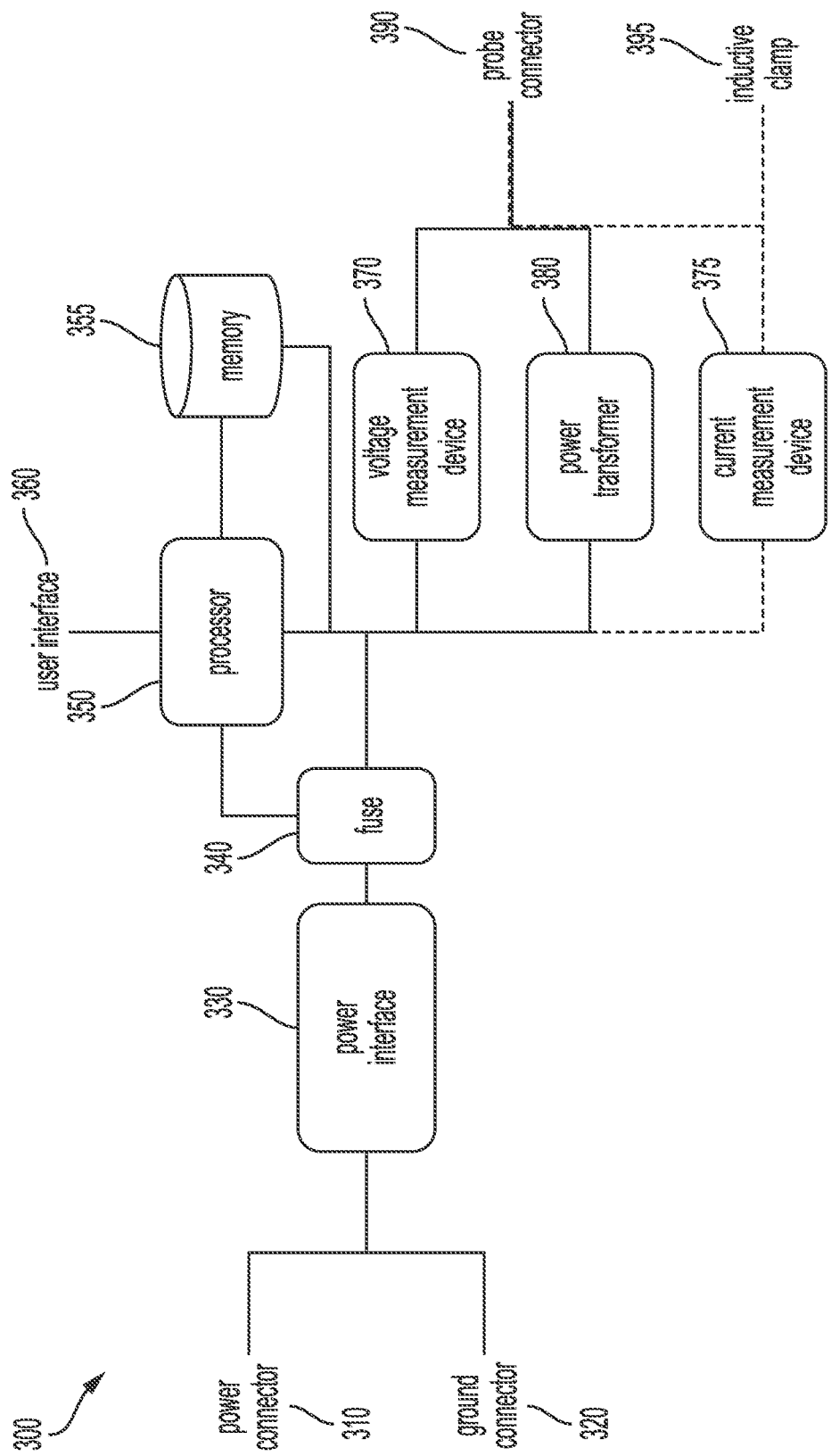
FIG. 7 shows a schematic diagram of an exemplary probe device.

FIG. 7 shows a logical schematic 300 of a probe device having a power connector 310, a ground connector 320, a power interface 330, a fuse 340, a processor 350, memory 355, a user interface 360, a voltage measurement device 370, current measurement device 375, a power transformer 380, and a probe connector 390. In some embodiments, a current measurement device 375 could be used to measure current flowing through probe connector 390. In other embodiments, such as with probe device 200a, a current measurement device 375 could be used to indirectly measure current flowing through wire 275 through inductive clamp 395.

Power interface 330 interfaces with both the ground connector 320 and the power connector 310 to receive power from a power source coupled to power connector 310 and to receive ground from a ground source coupled to ground connector 320. Power interface 330 also provides power to components of the probe device, such as processor 350, memory 355, measurement 370, and power transformer 380, via fuse 340. If processor 350 detects a power surge in one of the connected devices, or if fuse 340 detects a power surge from power connector 310, a command could be sent to fuse 340 to break a power connection between power interface 330 and any of processor 350, memory 355, voltage measurement device 370, power transformer 380, and/or current measurement device 375 and prevent the power surge from damaging any of the electronic components of the probe device. When a user transmits a break command from user interface 360 (e.g. via break button 131 or break button 231), processor 350 could receive the command and send a reset command to fuse 340 to reset the fuse and allow power to flow again from power interface 330.

Processor 350 executes software instructions saved on memory 355 to control the various electrical components of the probe device and to process commands transmitted by user interface 360. For example, where user interface 360 transmits a command to processor 350 to operate in voltage measurement mode, processor 350 could transmit a command to voltage measurement device 370 to measure a voltage via probe connector 390 and output that measured voltage amount to a display of user interface 360. Where user interface 360 transmits a command to processor 350 to operate in current measurement mode to measure current flowing through probe connector 390, processor 350 could transmit a command to current measurement device 375 to measure current flowing through probe connector 390 and outputs that measured current amount to a display of user interface 360. Where user interface 360 transmits a command to processor 350 to operate in current measurement mode to measure current flowing through inductive clamp 395, processor 350 could transmit a command to current measurement device 375 to inductively measure current from wire 275 within inductive clamp 395 and outputs that measured current amount to a display of user interface 360. In some embodiments, the measured attributes could temporarily be saved on memory 355 to be output to a display of user interface 360 over a period of time, or at a later time.

Where user interface 360 transmits a command to processor 350 to operate in power mode at a specified voltage (e.g. 3V, 5V, or 12V), processor 350 could transmit a command to power transformer 380 to transmit the specified voltage from power connector 310 to probe connector 390. When the probe device is in power mode, processor 350 could also activate a positive light of user interface 360 (e.g. positive light 136 of probe device 100*a*), and could transmit a command to user interface 360 to deactivate the display that displays a measured voltage. Where user interface 360 transmits a command to processor 350 to operate in ground mode, processor 350 could transmit a command to power transformer 380 to transmit the ground voltage from ground connector 320 to probe connector 390. When the probe device is in ground mode, processor 350 could also activate a negative light of user interface 360 (e.g. negative light 137 of probe device 100*a*), and could transmit a command to user interface 360 to deactivate the display that displays a measured voltage. Where user interface 360 transmits a command to processor 350 to activate a speaker when voltage is flowing through probe connector 390 (e.g. because power transformer 380 is transmitting voltage from power connector 310, because voltage measurement device 370 detects a voltage from probe connector 390, or because current measurement device 375 detects a current from probe connector 390), then processor 350 could transmit a buzzing noise to a speaker of user interface 360 when a voltage or current is detected to be flowing through probe connector 390.

In preferred embodiments, the probe device is configured such that voltage measurement device 370 and power transformer 380 cannot be activated simultaneously. This is to ensure that the device does not apply and measure voltage or current simultaneously.

Using the disclosed embodiments, a user could easily use a probe device, such as probe device 100*a* or probe device 200*a*, to apply power, apply ground, measure voltage, or measure current of an electronic device all with just one hand.

For example, a user could use probe device 100*a* to measure voltage of an electronic device by coupling power connector 120 to a power source, such as by plugging a male plug into a female A/C outlet, and by coupling ground connector 110 to a ground source, such as a conductive body of the electronic device. The user could then ensure that main switch 133 is in the measure position, for example by using a thumb to manipulate main switch 133, or by not applying any force to main switch 133 in embodiments where main switch 133 is biased to always return to the measure position when no force is applied to main switch 133. When main switch 133 is in the measure position, the user could then manipulate grip 160 to position the conductive tip 152 of probe device 100*a* to any conductive surface of the electronic circuit under test to determine how much voltage is that conductive surface has as compared to ground. Probe device 100*a* would then measure the voltage, and display the measured voltage on display 135, illuminate the positive light 136 if the measured voltage is greater than zero, and illuminate the negative light 137 if the measured voltage is zero. If the user is in a position where they cannot see display 135, the user could push beeper button 132 to activate the beeper, instructing probe device 100*a* to make an audible beep if the measured voltage is greater than zero, and not make an audible beep if the measured voltage is zero.

If the conductive surface of the electronic circuit under test is in an area that cannot accommodate the full length of probe device 100*a*, the user could rotate probe body 140 relative to main body 130 by grabbing probe body 140 with one hand and main body 130 with another hand and twisting to move probe device 100*a* from the first configuration shown in FIG. 2 to the second configuration shown in FIG. 3A. This way, conductive tip 152 could be more easily maneuvered behind obstacles or around short passages that cannot accommodate the full length of probe device 100*a*. In some embodiments where a user might need to use a probe connector of a different shape or size, the user could unplug probe connector 150 from probe body 140 and could plug a new probe connector into the female socket.

Should a user wish to temporarily apply power or ground to an electronic circuit under test (e.g. if the user wishes to activate the electronic device but it is not plugged in, or if the user wishes to discharge the electronic device to be able to move it to a second location), the user could use their thumb to push main switch 133 to the positive position, or pull main switch 133 to the negative position. When main switch 133 is in the positive position, probe device 100a could activate the positive warning light 136, and could activate a beeper if the beeper has been turned on. When main switch 133 is in the negative position, probe device could activate the negative warning light 137. If a power surge activates an internal fuse of probe device 100a, the probe device could break a circuit between the power from power connector 120 and one or more electrical components of probe device 100a, and the user could press breaker reset button 131 to reset the internal fuse. All of the essential operations of probe device 100a can be performed easily with one hand once the user has connected power connector 120, ground connector 110, and has set probe device 100a to the proper straight or angled configuration.

A user could also use probe device 200a to perform similar functions, such as measuring voltage, applying power, applying ground, and measuring voltage, and could also use probe device 200a to inductively measure current of a wire, such as wire 275. The user could first use their thumb to push current switch 238 from the off position to one of the active positions, such as 10 mV/A, which would trigger probe device 200a to alter display 235 from displaying the word VOLT to displaying the word AMP as an indicator that probe device 200a is now in current-measurement mode. The user could then use their fingers to pull on lever 262 and open hinged core 272. Once hinged core 272 is open, the user could move probe device 200a to wrap either stationary core 274 or hinged core 272 around wire 275 under test and release lever 262 to close hinged core 272. Probe device 200a would then indirectly measure current in wire 275 via induction, which would then be displayed on display 235.

Figure 8:
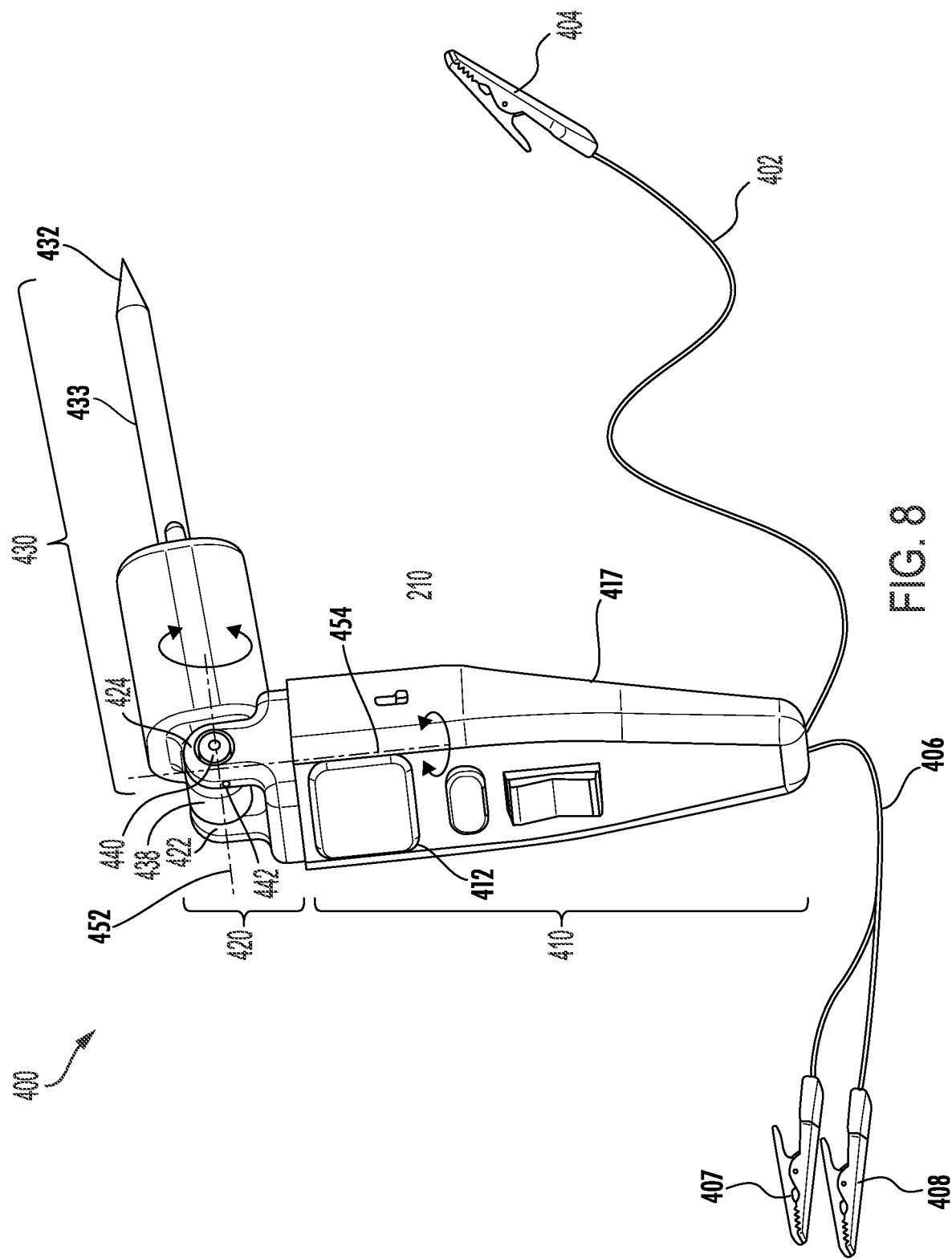
FIG. 8 shows a side perspective view of another exemplary probe device having a probe body 430 and a main body coupled by a joint body and a pin.
Figure 10:
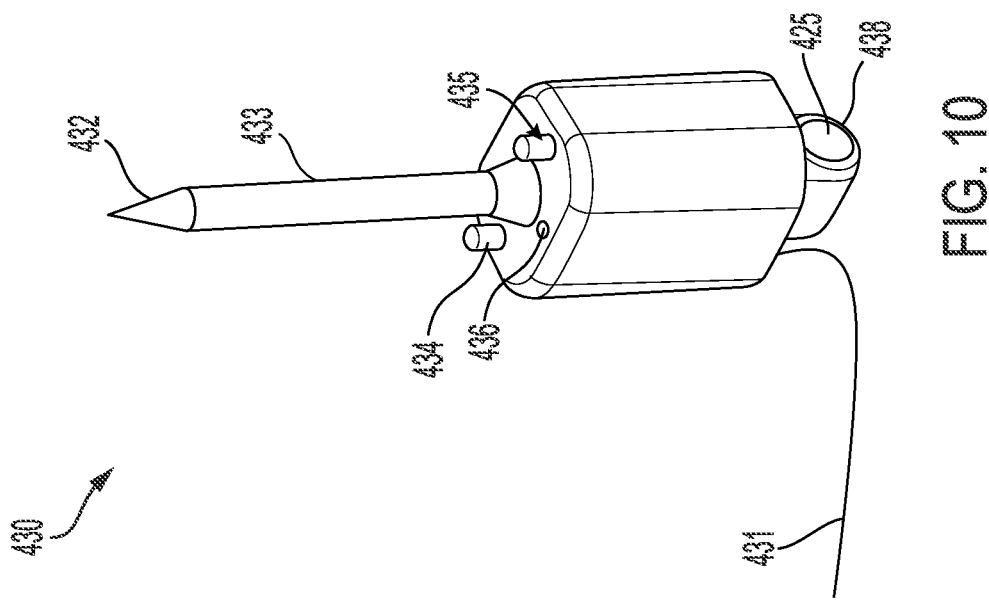
FIG. 10 shows a top perspective view of the probe body of FIG. 8.
Figure 11:
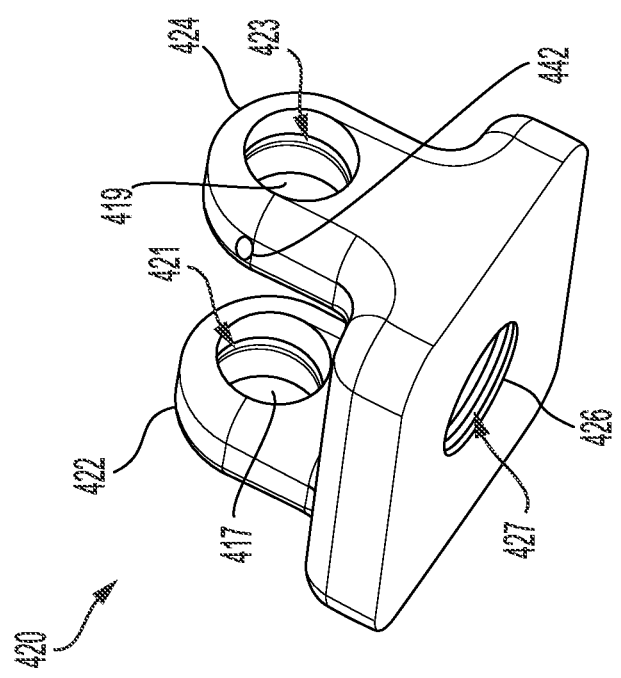
FIG. 11 shows a bottom perspective view of the joint body of FIG. 8.

Referring now to FIGS. 8-12, a probe device 400 may have a main body 410, a joint body 420, and a probe body 430. As shown in FIG. 11, the joint body 420 may have an aperture 426, which may be configured to receive the shaft 411 of the main body 410 shown in FIG. 9. FIG. 8 shows the joint body 420 mounted on the main body 410 when the shaft 411 is received by the aperture 426. The shaft 411 of the main body 410 may have an indent 415 (see FIG. 9) that circumscribes the outer circumference of the shaft 411 to mate with the projection 427 (see FIG. 11) of the aperture 426 which circumscribes the inner circumference of the aperture. Such a configuration may help to ensure that the joint body 420 stays on the main body as the as the main body 410 rotates relative to the joint body 420 along the axis 454 shown in FIG. 8. Thus, the mechanical, rotary connection between the aperture 426 of the joint body 420 and the shaft 411 of the main body 410 may collectively form a joint that allows the probe body 430 and the main body 410 to rotate relative to one another about the axis 454. While the mechanical connection between the joint body 420 and the main body 410 forms a rotary joint, other types of joints may be used between the joint body 420 and the main body 410 may be used, such as a hinge joint, a pivot joint, a ball and socket joint, a saddle joint, or a condyloid joint. While the shaft 411 is shown having the indentation 415 sized to mate with the projection 427, other rotational coupling mechanisms may be used to facilitate a rotary joint mechanical coupling between the shaft 411 and the aperture 426, such as a ball bearing mechanism or a friction fit. Moreover, an opposing configuration is contemplated such as an indentation in the aperture 426 that is sized and disposed to mate with a projection formed in the shaft 411. Allowing the joint body 420 to rotate about the shaft 411 along the axis 454 shown in FIG. 8 allows a user to rotate the probe body 430 relative to the main body 410 about the axis 454 to ensure that a user may easily manipulate the probe body 430 while yet maintaining a direct view of the display 412.

Figure 12:
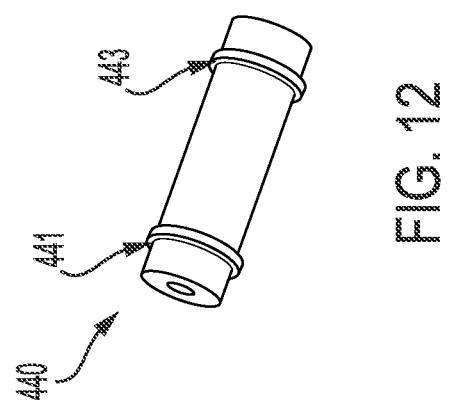
FIG. 12 shows a side perspective view of the pin of FIG. 8.
Figure 13:
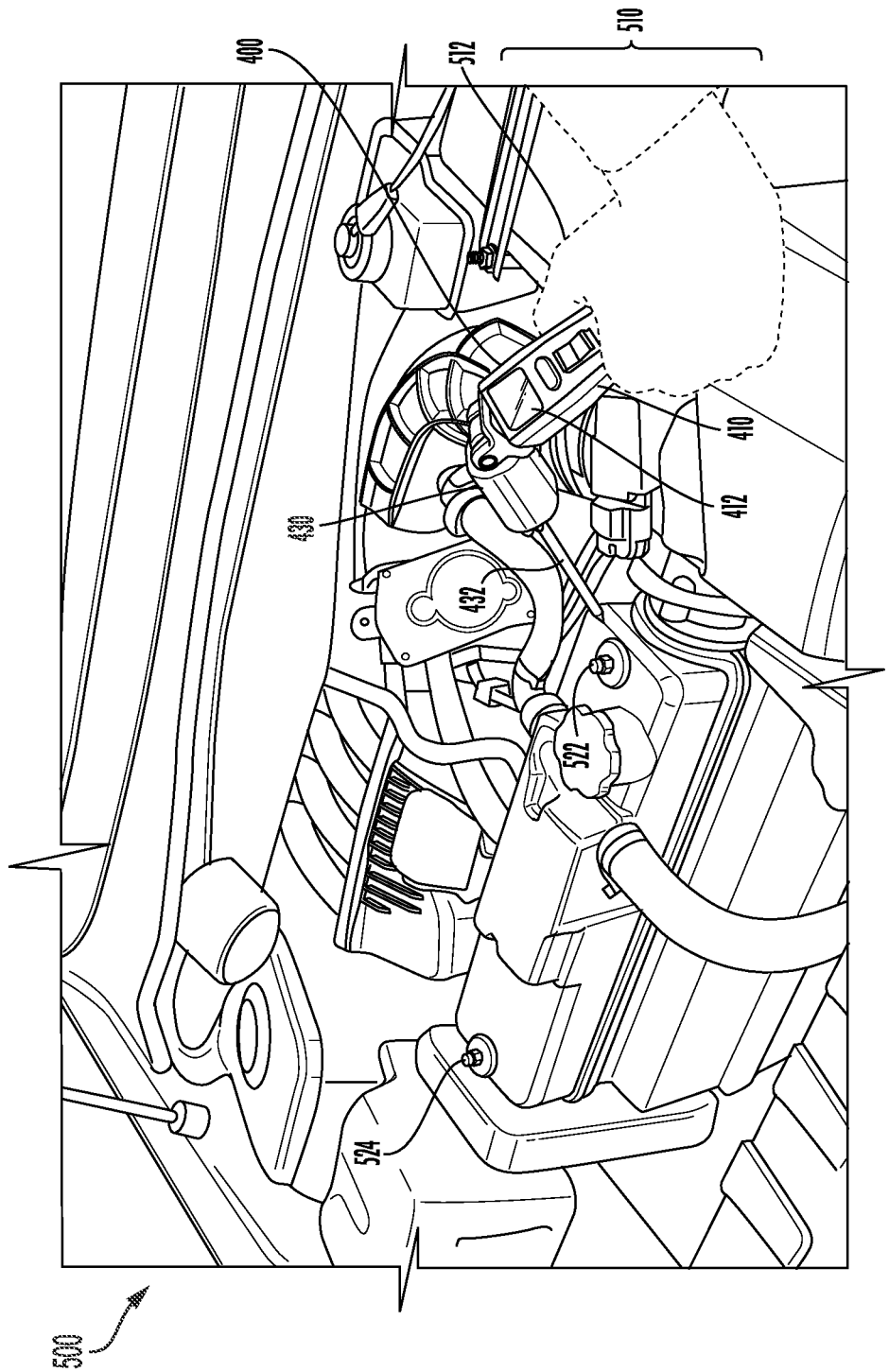
FIG. 13 shows a top perspective view of the probe device being used in a vehicle.

As shown in FIG. 11, the joint body 420 may also have a left knuckle 422 and a right knuckle 424 sized and disposed to receive the pin 440 of FIG. 12 via the apertures 417 and 419, respectively. In addition, the probe body 430 (see FIG. 10) may also have a knuckle 438 having an aperture 425 sized and disposed to receive the pin 440. As shown in FIG. 8, the knuckle 438 of the probe body 430 may be disposed between the left knuckle 422 and the right knuckle 424 of the joint body, and the pin 440 may be inserted through the apertures of the left knuckle 422 and right knuckle 424 of the joint body 420 and the aperture of the knuckle 438 of the probe body 430. The pin 440 may be retained in the knuckles 422, 424 via a set screw 442 and be friction fit. In such a configuration, the probe body 430 may rotate relative to the joint body 420 along the axis 452 shown in FIG. 8. The pin 440 may then be locked in place within the knuckles 422, 424, and 438 by tightening the set screw 442 shown in FIGS. 8 and 12. Thus, the mechanical, hinged connection between the knuckles 422 and 424 of the joint body 420, the knuckle 438 of the probe body 430, and the pin 440 may collectively form a joint that allows the probe body 430 and the main body 410 to rotate relative to one another about the axis 452. While the mechanical connection between the joint body 420 and the probe body 430 forms a hinge joint, other joints between the joint body 420 and the probe body 430 may be used, such as a rotary joint, a pivot joint, a ball and socket joint, a saddle joint, or a condyloid joint. It should be understood that the pin 440 may also have another set screw installed on the opposite side on knuckle 422. The pin 440 may also have ringed detents 441 and 443 that may be sized to mate with the ringed indents 421 and 423 of the left knuckle 422 and the right knuckle 424, respectively, when set screws, such as the set screw 442, are tightened. Other coupling mechanisms may be used to facilitate movement about hinged mechanical coupling, such as a detent in the knuckles and a matching indent in the pin or ball bearing joints.

While a rotary joint is shown as being used to allow the main body 410 to rotate relative to the joint body 420 along the axis 454 and a hinge joint is shown as being used to allow the probe body 430 to rotate relative to the joint body 420 along the axis 452, any suitable joint that allows one body to rotate relative to the other body may be used, such as a ball and socket joint, a saddle joint, a condyloid joint, a hinge joint, a rotary joint or a pivot joint. While a single joint body 420 is shown as interposed between the main body 410 and the probe body 430 to provide two separate axis of rotation, a plurality of rotary joints may be interposed between the main body 410 and the probe body 430 to allow more than two axes of rotation between the main body 410 and the probe body 430, which would enable the probe body 430 to be oriented in any number of configurations relative to the main body 410, allowing such a probe device to snake through any number of obstacles during use.

Figure 9:
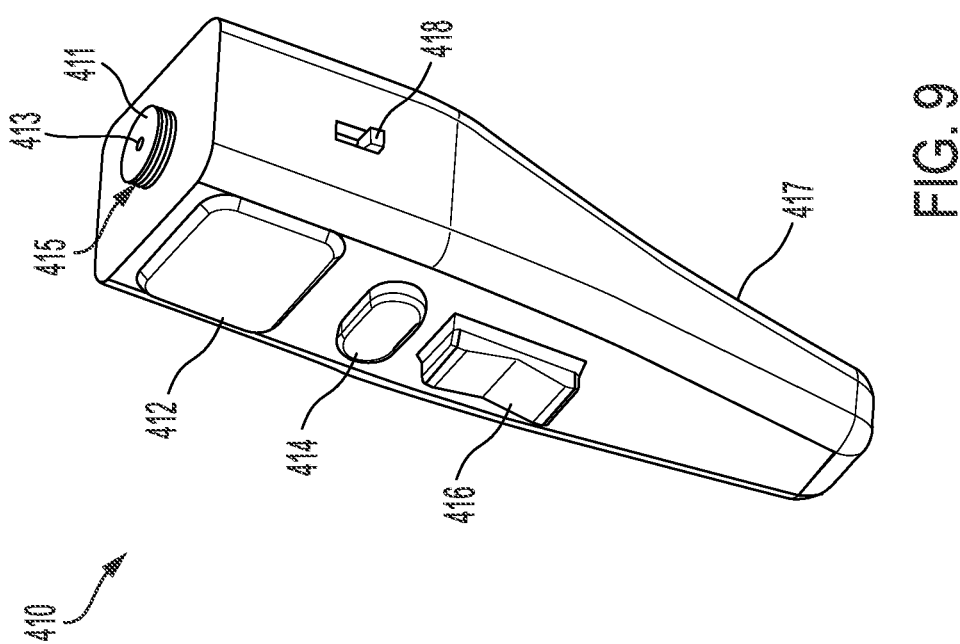
FIG. 9 shows a side perspective view of the main body of FIG. 8.

As shown in FIG. 9, the shaft 411 of the main body 410 may also have a port 413 that allows one or more cables, such as the cable 431 of the probe body 430 shown in FIG. 10, to plug into the probe body 430 and provide an electrical connection between the probe body 430 and the main body 410. The cable 431 may be routed through the aperture 426 of the joint body 420 and connected to the electronics located in the main body 410 via the port 413. Allowing at least one cable 431 of the probe body 430 to plug into the port 413 allows for electronic communication between the probe body 430 and the main body 410. The cable 431 may have a plurality of wires that allow electronic communication between the probe body 430 and the main body 410. For example, a first wire in the cable 431 may be used to transmit a signal from a processor of the main body to a heating circuit of the probe body 430 to activate a heating circuit, while a second wire in the cable 431 may be used to close a circuit between the ground terminal 404 and the conductive probe tip 432. Since the main body 410 only rotates 360°, the cable 431 does not get tangled as the probe body 430 rotates relative to the main body 410.

As shown in FIG. 8, the probe device 400 may have a ground cable 402 with a ground terminal 404 that may be configured to couple to a ground source, such as the frame of a car. The ground terminal 404 acts as a conductive ground connector that may be used to measure a metric of a device under test. For example, when a user touches the conductive probe tip 432 of the probe device 400 to a conductive test site of a device under test, the processor of the probe device 400 may calculate a voltage between the probe tip 432 and the ground terminal 404, or calculate a current between the probe tip 432 and the ground terminal 404 at a specified resistance. The probe device 400 may also have a power cable 406 with a positive terminal 407 and a negative terminal 408 that may be coupled to positive and negative terminals of a power source, such as a car battery or cigarette lighter. The power cable 406 may be used to deliver power to portions of the probe device 400, such as the processor, the probe tip 432, or to a heating circuit of the probe body 410. The conductive probe tip 432 may extend from an insulated shaft 433 that may comprise an insulated surface made of a material that both conductively insulates and thermally insulates the surface from the core of the shaft 433—for example a rubber or silicone.

Figure 4:
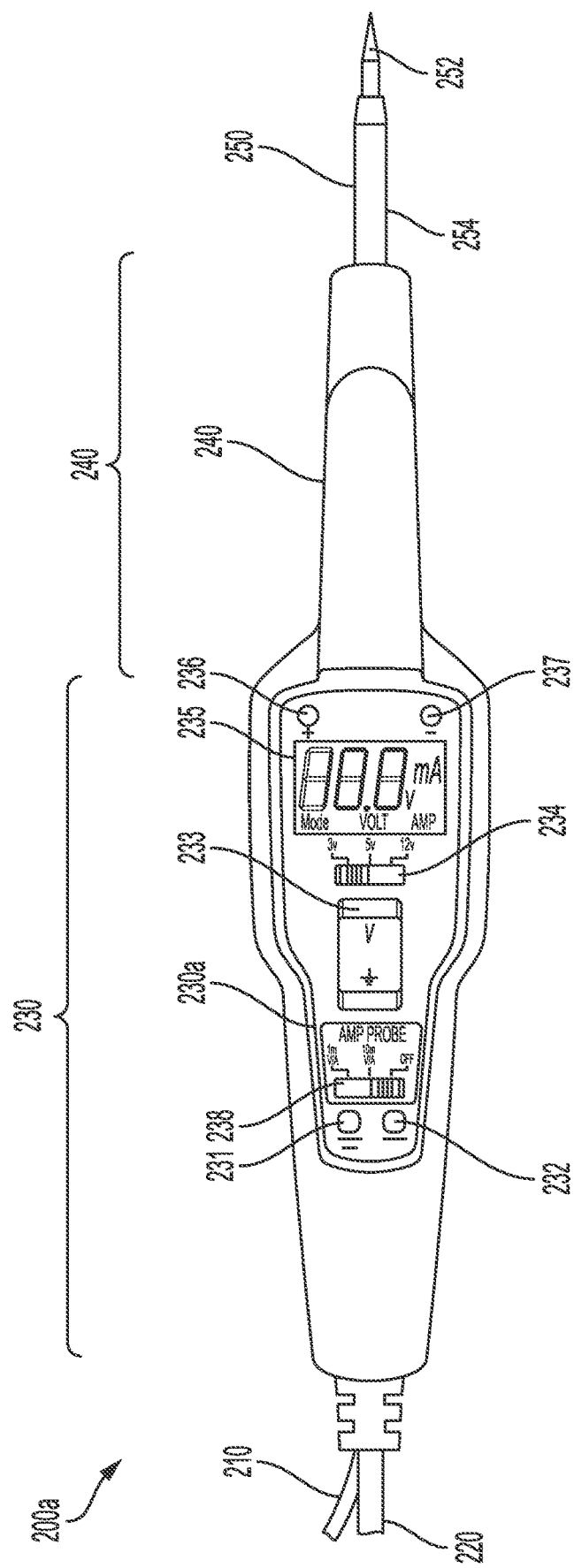
FIG. 4 shows a top view of another exemplary probe device having an inductive clamp.
Figure 5:
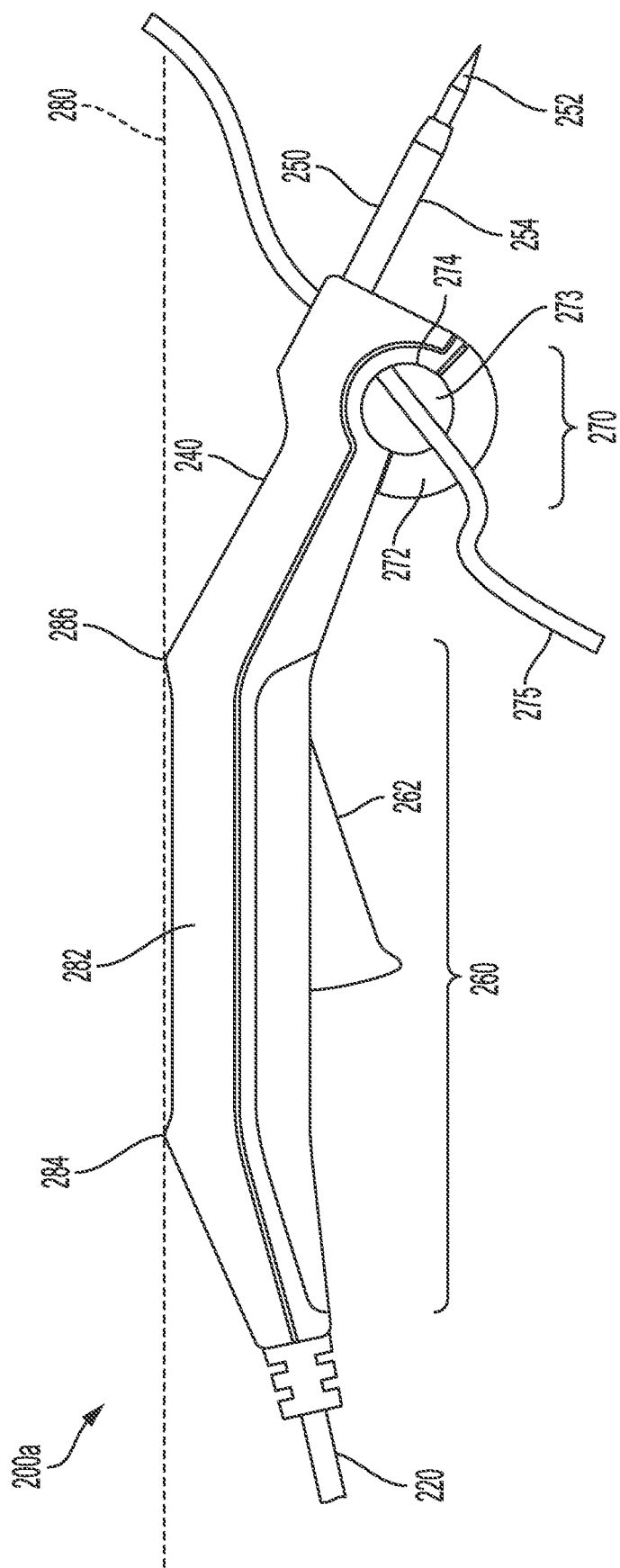
FIG. 5 shows a side view of the probe device of FIG. 4.

As shown in FIGS. 9 and 10, the main body 410 and the probe body 430 may have one or more user interfaces, such as a display 412, a voltage switch 418, a main switch 416, a positive light 434 (e.g., light emitting diode), a negative light 435, and a breaker reset button 436, which may function similarly to the display 235, voltage switch 234, main switch 233, positive light 236, negative light 237, and breaker reset button 231 of the user interface 230 of FIG. 4, respectively. A processor may be disposed within the walls of the main body 410 to transmit signals via the cable 431 to the probe body 430, such as signals to activate or deactivate the positive light 434 and negative light 435, or signals to activate a heating element 685 (see FIG. 14) in the probe body 430. The main body 410 may also have a soldering switch 414, which may be used to transmit a signal to the processor to activate a heating element of the probe body 430. The heating element may be in heat conduction to the probe tip 432 so that, when the heating element heats up, the probe tip heats up too as well. A signal from the processor may be transmitted to a heating element 687 (see FIG. 14) of the probe body 430 via the cable 431 to heat the probe tip 432 to a hot enough temperature to melt solder, for example to a temperature at least 350° F., 365° F., 375° F. or 400° F. The insulated shaft 433 may comprise an insulated material that thermally insulates the surface from the core of the shaft 433—for example a rubber or silicone. Such insulation preferably insulates the surface temperature of the probe shaft to be at most 200° F. when the probe tip 432 is heated to a temperature of 400° F. via the heating element 687.

As shown in FIG. 13, the probe device 400 may be used to test a device under test 500 without needing a user 510 to maneuver their hand 512 around obstacles to touch the conductive probe tip 432 conductive test sites, such as conductive test sites 522 and 524. The user 510 may rotate the probe body 430 relative to the main body 410 along the axis 452 shown in FIG. 8 to allow the probe body 430 to fold along multiple planes of rotational freedom. The user 510 may also rotate the probe body 430 relative to the main body along the axis 454 shown in FIG. 8 to allow the probe body 430 to rotate about the main body 410 along 360 degrees of rotational freedom. Allowing multiple axes of rotational freedom allows the user 510 to hold the main body 410 using their hand 512 while looking flat at the user interface display 412 while rotating the conductive probe tip 432 in an appropriate direction to still touch conductive test sites 522 and 524. The main body 410 may remain stationary in the user's hand 512 while the probe body 430 may be configured to rotate along multiple non-parallel planes, such as the X, Y, and/or Z planes. The first and second axes 452, 454 are shown as being perpendicular to each other. However, it is also contemplated that the first and second axes 452, 454 may be at other angles relative to each other such as between 45 to 90 degrees.

A user may use the probe device 400 to perform any suitable metric measurement of a device under test, such as an electric load continuity test, voltage measurement or a current measurement. An electric load continuity test may be conducted, for example, to determine if there exists a bad connection in a circuit. For example, both of the conductive test sites 522 and 524 may be located on a common bus of a circuit for a device under test that is connected to a power supply that provides 12.2 V. A user may configure the probe device 400 to be in voltage measurement mode using the voltage switch 418 (shown in FIG. 9) and view the current voltage flowing through the conductive probe tip 432 on the display 412 when testing the device under test 500 in FIG. 13. The user may touch the conductive probe tip 432 to the conductive test site 522 and to the conductive test site 524, and the user may then view the display 412 to measure the voltage at both conductive test sites. The user may expect to see a reading of 12.2V for both measurements, as both the conductive test site 522 and the conductive test site 524 are located on the same bus connected to the power supply that provides 12.2 V. If the measured voltage at each of the conductive test sites differs by more than 0.5 V (e.g. the measurement at the conductive test site 522 is 12.2V, while the measurement at the conductive test site 524 is 11.5V), the user may then understand that there is a bad connection between the conductive test sites 522 and 524. The minimum threshold voltage drop used to determine if a circuit is bad may vary, for example a user may determine that a circuit is bad if the measured voltage at the conductive test sites vary by more than 0.1 V or 2 V. Such an electric load continuity test may also be performed on any number of conductive surfaces that share a common electrical bus, such as a wire or a multiplexor.

Figure 14:
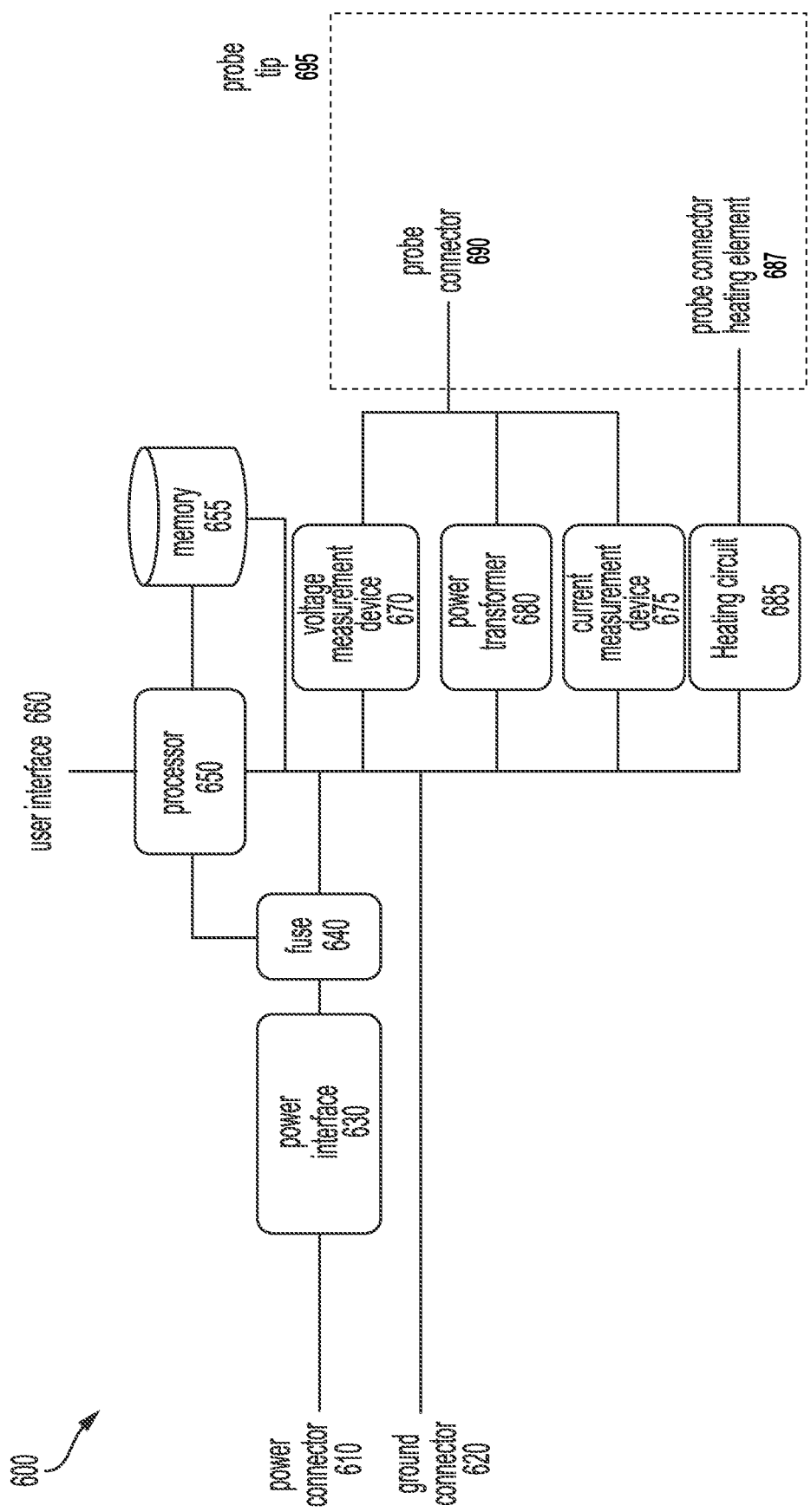
FIG. 14 shows a schematic diagram of an exemplary probe device.

FIG. 14 shows a logical schematic 600 of a probe device having a power connector 610, a ground connector 620, a power interface 630, a fuse 640, a processor 650, memory 655, a user interface 660, a voltage measurement device 670, current measurement device 675, a power transformer 680, a probe connector 690, and a probe connector heating element 687.

Power interface 630 interfaces the power connector 610 to receive power from a power source coupled to power connector 610 and provides power to components of the probe device, such as processor 650, memory 655, measurement 670, and power transformer 680, via fuse 640. The processor 650 may be configured to detects a power surge in one of the connected devices, or the fuse 640 may be configured to detect a power surge from power connector 610, and, in response, trigger a command to fuse 640 to break a power connection between the power interface 630 and any of processor 650, memory 655, voltage measurement device 670, power transformer 680, and/or current measurement device 675, thereby preventing the power surge from damaging any of the electronic components of the probe device. When a user transmits a break command from the user interface 660 (e.g. via the breaker reset button 436 of FIG. 9), the processor 650 may be configured to, in response to receiving the command, send a reset command to fuse 640 to reset the fuse and allow power to flow again from power interface 630. The ground connector 620 may be conductively coupled to a bus that allows any of the processor 650, the voltage measurement device 670, and/or the current measurement device 675 to perform measurements against the ground source, such as a measurement of a voltage at the probe connector 690 as compared to the ground source, or a current flowing through the probe connector 690 to the ground source.

The processor 650 may be configured to execute software instructions saved on memory 655 to control the various electrical components of the probe device and to process commands transmitted by user interface 660. For example, the where user interface 660 transmits a command to processor 650 to operate in voltage measurement mode, the processor 650 may transmit a command to voltage measurement device 670 to measure a voltage via probe connector 690 and output that measured voltage amount to a display of user interface 660. Such a configuration allows a user to perform a continuity test on the electronic load of an electronic device under test by connecting the probe device to the ground via the ground connector 620, and then by touching the probe tip 695 to a plurality of conductive test sites that share the same conductive bus such as a wire. For example, using the probe device 400 in FIG. 8, a user may attach the ground terminal 404 to a ground source, such as the body of a car. The user may then grip the handle 417 of the main body 410 to direct the conductive probe tip 432 to two or more conductive test sites that share the same conductive bus and look at the display 412 to determine the measured voltage at each conductive test site. If there is a bad connection between conductive test sites that share the same conductive node, the circuit's voltage may drop more than 0.5 V between one conductive test site and another (e.g. the user expects 12V but sees 11.2 V), which may be detected by the voltage measurement device 670 and sent to the user interface 660 for monitoring by a user.

Where the user interface 660 transmits a command to processor 650 to operate in current measurement mode to measure current flowing through probe connector 690, the processor 650 may be configured to transmit a command to current measurement device 675 to measure current flowing through probe connector 690 and output that measured current amount to a display of user interface 660. The processor 650 may be configured to temporarily save the measured attributes to the memory 355 to be output to a display (e.g. display 454 of FIG. 8) of the user interface 660 over a period of time, or at a later time.

Where user interface 660 transmits a command to processor 50 (e.g, user applies a force to the main switch 416 on the main body 410) to operate in power mode at a specified voltage (e.g. 3V, 5V, or 12V), the processor 650 may be configured to transmit a command to power transformer 680 to transmit the specified voltage from power connector 610 to probe connector 690. When the probe device is in power mode, the processor 650 may be configured to also activate an LED of user interface 660 (e.g. positive light 434 of probe body 430 in FIG. 10), and may be configured to transmit a command to user interface 660 to deactivate the display (e.g. the display 412 on the main body 410 of FIG. 9) that displays a measured voltage. Where user interface 660 transmits a command to processor 650 to operate in ground mode, the processor 650 may be configured to transmit a command to power transformer 680 to transmit the ground voltage from ground connector 620 to probe connector 690. When the probe device is in ground mode, the processor 650 may be configured to also activate a negative light of user interface 360 (e.g. negative light 435 of the probe body 430 in FIG. 10), and may be configured to transmit a command to user interface 660 to deactivate the display (e.g. the display 412 of the main body 410 of FIG. 9) that displays a measured voltage. Where the user interface 660 transmits a command to processor 650 to activate a speaker when voltage is flowing through probe connector 690 (e.g. in response to detecting that power transformer 680 is transmitting voltage from power connector 610, in response to detecting that the voltage measurement device 670 detects a voltage from probe connector 690, or in response to detecting that the current measurement device 675 detects a current from probe connector 690), then processor 650 may be configured to transmit a buzzing noise to a speaker of the user interface 660 when a voltage or current is detected to be flowing through the probe connector 690.

The user interface 660 may be configured to transmit a command to the processor 650 to activate a heating element, such as via activation of the soldering switch 414 in FIG. 9. Upon receiving a trigger from the user interface 660, the processor 650 may be configured to transmit a signal to activate the heating circuit 685, such as by transmitting current through a resistor, to heat up the probe connector heating element 687. Allowing the probe connector to be heated allows a user to temporarily change a probe device, such as the probe device 400 in FIG. 8, to act as a temporary welding hand, or a soldering hand, by providing a heated wand in the form of the heated probe tip 432 so the user may solder some wire in case it's needed.

The probe device may be configured such that the modules cannot be activated simultaneously, for example the voltage measurement device 670 and power transformer 680, the current measurement device 675 and the power transformer 680, or the heating circuit 685 and the voltage measurement device 670. Such a configuration ensures that the device does not damage components, or apply power and measure voltage simultaneously.

Using the disclosed embodiments, a user could easily use a probe device, such as probe device 400, to apply power, apply ground, measure voltage, measure current, or apply solder to a conductive surface of an electronic device all with just one hand while easily viewing and accessing controls and the display of the main body 410, as seen in FIG. 13.

The above description is given by way of example, and not limitation. Given the above disclosure, one skilled in the art could devise variations that are within the scope and spirit of the invention disclosed herein, including various ways of manufacturing and using probe devices. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A probe device, comprising:
   a conductive ground connector;
   a main body having a hand-held grip for the probe device;
   a probe body having a conductive probe tip for detecting a voltage at a test point of an external electrical system;
   a screen on the main body that displays the detected voltage at the conductive probe tip when the conductive probe tip contacts the test point of the external electrical system;
   a joint body attached to the main body and the probe body, the joint body having:
      a first joint that allows the probe body to rotate about a first axis relative to the main body; and
      a second joint that allows the probe body to rotate about a second axis, at an angle substantially perpendicular to the first axis.

2. The probe device of claim 1, wherein the first joint comprises a hinge joint.

3. The probe device of claim 2, wherein the second joint comprises a rotary joint.

4. The probe device of claim 1 wherein the first joint comprises a hinged connection between the joint body and the probe body, and the second joint comprises a rotary connection between the joint body and the main body.

5. The probe device of claim 4, wherein the joint body comprises a pair of knuckles configured to wrap around a pin of the probe body to form the first joint.

6. The probe device of claim 4, wherein the joint body comprises a housing having a cavity configured to accept a shaft of the main body to form the second joint.

7. The probe device of claim 1, wherein the probe body comprises a heating circuit that heats the conductive probe tip to at least 365° F. when a current is directed through the heating circuit.

8. The probe device of claim 7, wherein a processor is programmed to direct current through the heating circuit upon activation of a soldering switch.

9. The probe device of claim 1 further comprising:
   a heating circuit in thermal communication to the conductive probe tip for heating the conductive probe tip to at least 365° F.;
   a screen on a main body attached to the conductive probe tip, the screen operative to display a voltage at the conductive probe tip when the conductive probe tip contacts the test point of the external electrical system;
   a processor that when a set of instructions are executed on the processor, is programmed to activate the heating circuit and cause current to be directed through the heating circuit to heat the conductive probe tip.

10. The probe device of claim 9, further comprising a soldering switch, wherein the processor is configured to execute the set of instructions upon activation of the soldering switch.

11. The probe device of claim 10 wherein the main body has the soldering switch.

12. The probe device of claim 1, wherein the conductive probe tip extends from an insulated sleeve.

* * * * *